(12) United States Patent
Dusatko

(10) Patent No.: US 10,606,306 B2
(45) Date of Patent: Mar. 31, 2020

(54) METHOD OF REDUCING POWER DISSIPATION IN A CLOCK DISTRIBUTION NETWORK FOR INTEGRATED CIRCUIT

(71) Applicant: INPHI CORPORATION, Santa Clara, CA (US)

(72) Inventor: Tomas Alexander Dusatko, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 4 days.

(21) Appl. No.: 16/263,705

(22) Filed: Jan. 31, 2019

(65) Prior Publication Data

US 2019/0163230 A1 May 30, 2019

Related U.S. Application Data

(63) Continuation of application No. 15/910,875, filed on Mar. 2, 2018, now Pat. No. 10,234,892, which is a
(Continued)

(51) Int. Cl.
| | |
|---|---|
| *G06F 1/10* | (2006.01) |
| *H01F 17/00* | (2006.01) |
| *H03H 7/01* | (2006.01) |
| *G06F 1/32* | (2019.01) |
| *H03H 11/28* | (2006.01) |

(Continued)

(52) U.S. Cl.
CPC .......... *G06F 1/10* (2013.01); *G06F 1/32* (2013.01); *H01F 17/0006* (2013.01); *H01L 23/66* (2013.01); *H03H 7/0123* (2013.01); *H03H 11/28* (2013.01); *H01L 2223/6627* (2013.01); *H03H 7/09* (2013.01); *H03H 7/383* (2013.01)

(58) Field of Classification Search
None
See application file for complete search history.

(56) References Cited

U.S. PATENT DOCUMENTS

| | | | | |
|---|---|---|---|---|
| 8,791,742 | B2 * | 7/2014 | Garg | H03K 5/135 327/291 |
| 9,595,943 | B2 * | 3/2017 | Madhavan | H03K 5/00 |
| 2014/0035649 | A1 * | 2/2014 | Nedovic | G06F 1/08 327/299 |

* cited by examiner

*Primary Examiner* — Jeffery S Zweizig
(74) *Attorney, Agent, or Firm* — Richard T. Ogawa; Ogawa P.C.

(57) ABSTRACT

A method and circuit are provided to reduce power consumption of high-speed clocks that are distributed across an integrated circuit (IC). Example implementations seek to reduce the amount of power dissipated in typical clock distribution networks by turning the combination of a multi-port electrical network and transmission line into a multi-resonant structure. In an implementation, the multi-port electrical network is coupled between first and second segments of the transmission line. The multi-port electrical network includes series and shunt reactive circuit elements, such as series inductive reactance and a shunt inductive susceptance, configured to produce first and second resonances that cooperate to create a bandpass response across clock distribution frequencies. This bandpass response is created by the multi-resonant structure, which is a combination of the transmission line and the multi-port electrical network. Various implementations are provided, including single-ended, differential, multi-section, multi-output, and point-to-multi-point implementations, each with an optional low-speed mode switch.

20 Claims, 18 Drawing Sheets

Related U.S. Application Data continuation of application No. 15/403,041, filed on Jan. 10, 2017, now Pat. No. 9,939,841.

(51) Int. Cl.
*H01L 23/66* (2006.01)
*H03H 7/09* (2006.01)
*H03H 7/38* (2006.01)

Low-Frequency Resonance

High-Frequency Resonance

METHOD OF REDUCING POWER DISSIPATION IN A CLOCK DISTRIBUTION NETWORK FOR INTEGRATED CIRCUIT

CROSS REFERENCE TO RELATED APPLICATIONS

This application is a continuation of U.S. patent application Ser. No. 15/910,875 filed on Mar. 2, 2018, which is a continuation of U.S. patent application Ser. No. 15/403,041 filed on Jan. 10, 2017, now issued as U.S. Pat. No. 9,939,841 on Apr. 10, 2018, both of which are incorporated herein by reference in their entirety.

FIELD

The present disclosure relates to integrated circuits, including but not limited to methods and systems for clock distribution in an integrated circuit.

BACKGROUND

In recent years, the explosion in growth of network traffic has pushed serial data links to higher and higher rates. As a result, SERDES (serializer-deserializer) circuitry is required to be clocked at greater frequencies resulting in significant power dissipation in clock distribution and routing. Typically, in these systems a low-jitter, high-frequency clock is generated from a central phase-locked loop (PLL) and then distributed to critical circuitry such as a link's high-speed transmitter and receiver, as shown in FIG. 1.

The sub-blocks shown in FIG. 1 can be located a significant distance away from this PLL and thus, these clocks dissipate significant power as they are rebuffered across the integrated circuit (IC). Moreover, in multi-lane architectures high-speed clocks from a central PLL may be routed up to several millimeters to reach parallel SERDES TX-RX slices. Distributing CMOS clocks at rates of >20 GHz across far distances can easily dissipate 10's of mW and be a significant source of power consumption. With increasing data rates and associated clock frequencies, this problem will continue to get worse in the future.

It is, therefore, desirable to provide a clock distribution network for distributing a clock signal that addresses at least one drawback of existing approaches.

BRIEF DESCRIPTION OF THE DRAWINGS

Embodiments of the present disclosure will now be described, by way of example only, with reference to the attached Figures.

DETAILED DESCRIPTION

Figure 1:
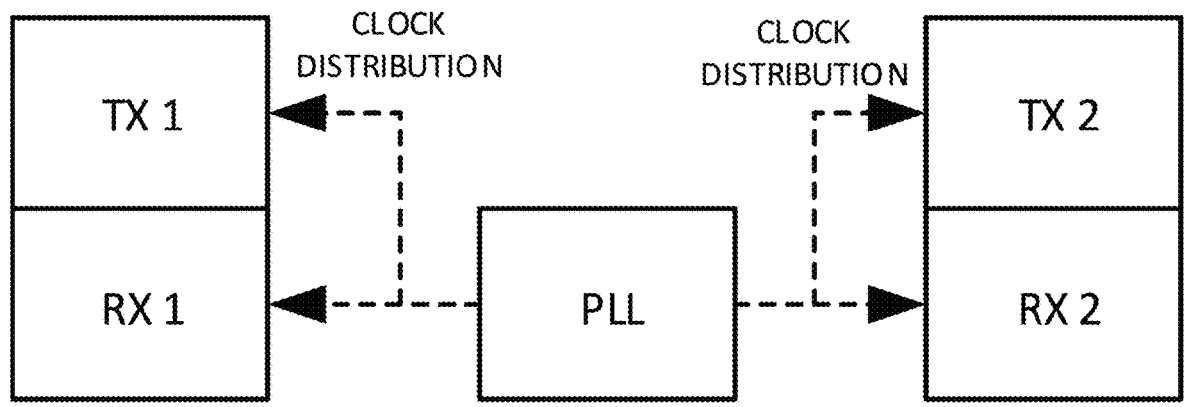
FIG. 1 is an example of a clock distribution network on an integrated circuit for distributing a clock signal from a source PLL to transmitter and receiver circuits.

A method and circuit are provided to reduce the power consumption of high-speed clocks that are distributed across an integrated circuit (IC). Example implementations seek to reduce the amount of power dissipated in typical clock distribution networks by turning the combination of a multi-port electrical network and transmission line into a multi-resonant structure. In an implementation, the multi-port electrical network is coupled between first and second segments of the transmission line. The multi-port electrical network includes a series inductive reactance and a shunt inductive susceptance configured to produce first and second resonances that cooperate to create a bandpass response across clock distribution frequencies. This bandpass response is created by the multi-resonant structure, which is a combination of the transmission line and the multi-port electrical networks. Various implementations are provided, including single-ended, differential, multi-section, multi-output, and point-to-multi-point implementations, each with an optional low-speed mode switch.

In an aspect, the present disclosure provides a clock distribution network comprising: a transmission line configured to distribute a high speed clock signal, the transmission line having first and second transmission line segments each having a source end and a load end; and a multi-port electrical network coupled between the load end of the first transmission line segment and the source end of the second transmission line segment. The multi-port electrical network and the transmission line cooperate to create a resonant structure. The multi-port electrical network comprises a series inductive reactance and a shunt inductive susceptance configured to create a first low-frequency resonance and a second higher-frequency resonance. The first and second resonances cooperate to create a bandpass response across a plurality of clock distribution frequencies associated with a bandwidth of the resonant structure.

In an example embodiment, the transmission line and the series inductive reactance cooperate to create the second high-frequency resonance, and the transmission line and the shunt inductive susceptance cooperate to create the first low-frequency resonance.

In an example embodiment: the series inductive reactance and the shunt inductive susceptance have a first inductive reactance value and a first inductive susceptance value, respectively, at a first frequency associated with the first low-frequency resonance; the series inductive reactance and the shunt inductive susceptance have a second series inductive reactance value and a second shunt inductive susceptance values, respectively, at a second frequency associated with the second higher-frequency resonance; the first low-frequency resonance is influenced by the first inductive reactance value and the first inductive susceptance value as well as reactance values of the first and second transmission line segments at the first frequency; and the second higher-frequency resonance is only influenced by the second series inductive reactance value and reactance values of the first and second transmission line segments at the second frequency.

In an example embodiment, at the first low-frequency resonance, the series inductive reactance and the shunt inductive susceptance cooperate with the first and second transmission line segments to produce a high-impedance at the source end of the first transmission line segment for optimal power injection and to produce a high impedance at the load end of the second transmission line segment for a maximum clock voltage output. At the second higher-frequency resonance, the series inductive reactance cooperates with the first and second transmission line segments to produce a high-impedance at the source end of the first transmission line segment for optimal power injection and to produce a high-impedance at the load end of the second transmission line segment for a maximum clock voltage output.

In an example embodiment, the multi-port electrical network comprises a transformer having primary and secondary magnetically coupled inductive elements in a center-tapped configuration, in which the primary and secondary magnetically coupled inductive elements each have the same inductance L and are related by a positive coupling coefficient k. In such an embodiment: the series inductive reactance comprises an equivalent series inductance defined by $(1-k) \cdot L$; and the shunt inductive susceptance comprises a shunt inductance defined by $k \cdot L$.

In an example embodiment, a spacing between first and second frequencies associated with the first low-frequency resonance and the second higher-frequency resonance, respectively, is adjustable to modify the bandpass response based on adjustment of a mutual inductance value of the primary and secondary inductors in the transformer, or based on adjustment of the inductance L of the primary and secondary inductors in the transformer.

In an example embodiment: the multi-port electrical network comprises a transformer having primary and secondary magnetically coupled inductive elements in a center-tapped configuration; the primary inductive element has a first terminal connected to the load end of the first transmission line segment and has a second terminal connected to a low impedance voltage path equivalent to ground; the secondary inductive element has a first terminal connected to the source end of the second transmission line segment and has a second terminal connected to the low impedance voltage path.

In an example embodiment, the series inductive reactance of the multi-port electrical network comprises first and second series inductors; and the shunt inductive susceptance of the multi-port electrical network comprises a shunt inductor.

In an example embodiment, the multi-port electrical network comprises a double-series, shunt peaking circuit comprising: a first series inductor coupled to the load end of the first transmission line segment; a second series inductor coupled to the source end of the second transmission line segment; and a shunt inductor coupled between first series inductor and the second series inductor.

In an example embodiment, the multi-port electrical network is connected to a low impedance path. In an example embodiment, the multi-port electrical network comprises a transformer having a center tap, the connection to the low impedance path comprises the center tap, and the multi-port electrical network further comprises a low speed mode switch provided at the center tap of the transformer.

In an example embodiment, the multi-port electrical network is composed of one or more metal layers in integrated circuit technology.

In an example embodiment, the first transmission line segment has a first length, and the second transmission line segment has a second length, the second length being different from the first length, and the multi-port electrical network comprises an asymmetric transformer.

In an example embodiment, the clock distribution network further comprises a plurality of output branches connected in parallel, the resonant structure is provided on one of the parallel output branches, and the clock distribution network further comprises a second parallel resonant structure provided on another one of the parallel output branches.

In an example embodiment, the transmission line is a first transmission line configured to distribute a first high speed clock signal and the multi-port electrical network is a first multi-port electrical network, and the resonant structure is a first resonant structure. In such an embodiment, the clock distribution network further comprises: a second transmission line configured to distribute a second high speed clock signal, the second high speed clock signal being a complement of the first high speed clock signal, the second transmission line having third and fourth transmission line segments each having a source end and a load end. The clock distribution network in this embodiment further comprises a differential multi-port electrical network comprising a first differential half and a second differential half. The first differential half comprises the first multi-port electrical network. The second differential half of the multi-port electrical network is coupled between the load end of the third transmission line segment and the source end of the fourth transmission line segment. The second differential half and the third and fourth transmission line segments cooperate to create a complementary resonant structure. The second differential half of the differential multi-port electrical network comprises a second series inductive reactance and a second shunt inductive susceptance configured to influence the creation of the first low-frequency resonance and the second higher-frequency resonance. The first and second resonances cooperate to create the same bandpass response across the complementary resonant structure as the bandpass response across the first resonant structure.

In an example embodiment, the multi-port electrical network is a first multi-port electrical network, and the resonant structure created by the cooperation of the first multi-port electrical network and the first and second transmission line segments is a first resonant structure. In such an embodiment, the transmission line further comprises third and fourth transmission line segments each having a source end and a load end, and the clock distribution network further comprises: a second multi-port electrical network coupled between the load end of the third transmission line segment and the source end of the fourth transmission line segment, the second multi-port electrical network and the third and fourth transmission line segments cooperating to create a second resonant structure. The second multi-port electrical network comprises a second series inductive reactance and a second shunt inductive susceptance configured to influence the creation of the first low-frequency resonance and the second higher-frequency resonance. The first and second resonances cooperate to create the same bandpass response across the second resonant structure as the bandpass response across the first resonant structure.

In an example embodiment, the clock distribution network further comprises: a first output branch provided at an output of the first multi-port electrical network; and a second output branch provided at an output of the second multi-port electrical network.

In another aspect, the present disclosure provides a clock distribution network comprising: a transmission line configured to distribute a high speed clock signal; and a multi-port electrical network coupled between first and second segments of the transmission line. The multi-port electrical network comprises a series inductive reactance and a shunt inductive susceptance configured to produce first and second resonances that cooperate to create a bandpass response across a plurality of clock distribution frequencies associated with a bandwidth of a combination of the transmission line and the multi-port electrical network.

In a further aspect, the present disclosure provides a differential clock distribution network comprising: first and second transmission lines configured to distribute first and second high speed clock signals, respectively, the second high speed clock signal being a complement of the first high speed clock signal. The clock distribution network further comprises a differential multi-port electrical network comprising a first differential half and a second differential half. The first differential half comprises a first multi-port electrical network coupled between first and second segments of the first transmission line, the first multi-port electrical network and the first transmission line cooperating to create a first resonant structure. The first multi-port electrical network comprises a first series inductive reactance and a first shunt inductive susceptance configured to produce first and second resonances that cooperate to create a bandpass response across a plurality of clock distribution frequencies associated with a bandwidth of the first resonant structure. The second differential half comprises a second multi-port electrical network coupled between first and second segments of the second transmission line, the second multi-port electrical network and the second transmission line cooperating to create a second resonant structure. The second multi-port electrical network comprises a second series inductive reactance and a second shunt inductive susceptance configured to influence the creation of the first low-frequency resonance and the second higher-frequency resonance. The first and second resonances cooperate to create the same bandpass response across the second resonant structure as the bandpass response across the first resonant structure.

In an example embodiment, the first and second multi-port electrical networks comprise first and second transformers, respectively, the first and second transformers each having a center tap, and the differential multi-port electrical network further comprises a low speed mode switch provided between a low impedance voltage path and the center taps of the first and second transformers.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described.

Typically, high-speed clocks are transmitted across the chip in dedicated clock routing channels with controlled impedances. At high clock frequencies, these wires can no longer be treated as simple lumped resistive-capacitive (RC) elements because the high-frequency (high-speed) clock signal has a wavelength that is comparable to the length of the wire. Since the clock signal is different at various points on the wire, it is helpful to model the wire as a transmission line with distributed RLCG parameters. These parameters describe the resistance (R), inductance (L), capacitance (C), and conductance (G) per unit length of the wire and govern its response at high frequencies.

Figure 2:
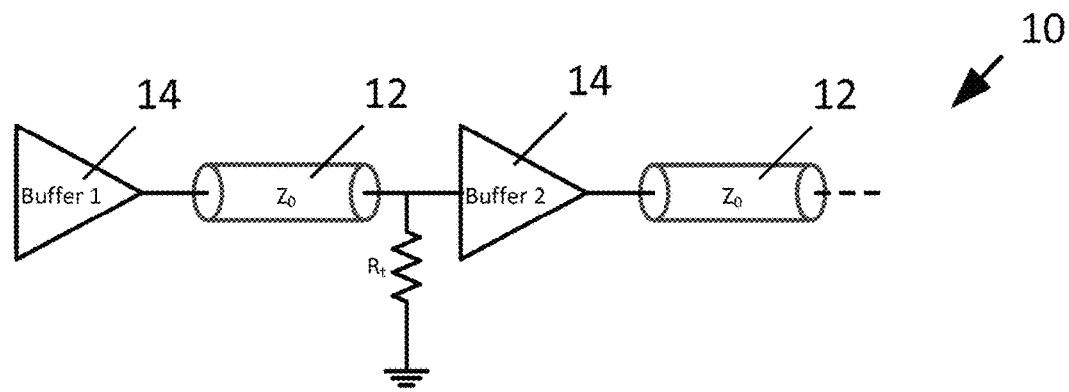
FIG. 2 is an example of a section of a known non-resonant clock distribution network constructed from buffers connected by segments of transmission line and impedance-matching resistors.

FIG. 2 shows a typical non-resonant clock distribution network 10, which consists of sections of transmission lines 12, buffered with active circuitry 14 to maintain a certain minimum signal amplitude along the length of the line. The number of transmission line sections 12 and buffers 14 will typically depend on the length between source and destination, and the signal loss of the line. Two common types of buffers for on-chip clock distribution are CMOS, which is a voltage-mode driver, and CML which is a current-mode driver. In both cases the buffer is designed to work with the logic levels of the overall system and the characteristic impedance of the transmission line. In addition, one or more resistors are typically added to the transmission line in order to match characteristic impedances and reduce signal reflections; however, the resistor also adds a source of power dissipation since it provides a path to ground.

Embodiments of the present disclosure seek to reduce the amount of power dissipated in typical clock distribution networks by turning a combination of a multi-port electrical network and transmission line into a multi-resonant structure, such as a wideband multi-resonant structure.

Figure 3:
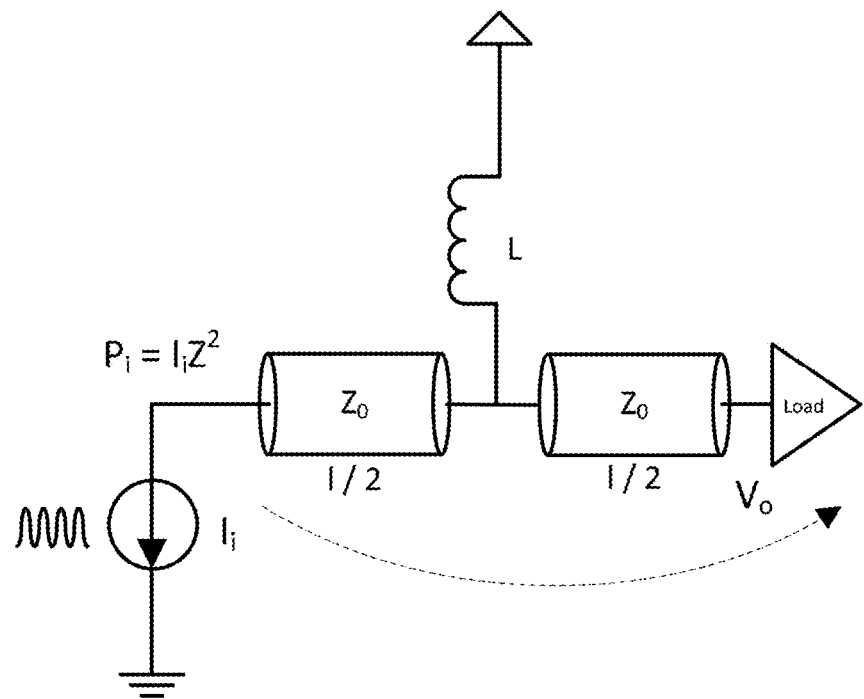
FIG. 3 is an example of a known resonant clock distribution network having only a single resonant frequency.

FIG. 3 is an example of a known resonant clock distribution network having only a single resonant frequency. Such known resonant clock distribution techniques are typically limited to only a very small range of frequencies around a single resonant peak, and can be referred to as single peak resonators.

Conventional single peak resonators have a parameter known as a damping quality factor, or Q-factor, which describes how well the resonator vibrates or oscillates at the peak frequency. The bandwidth of the circuit where the amplitude is greater than $1/\sqrt{2}$ the peak value is related to the Q-factor of the system as follows:

$$\Delta f = \frac{f_0}{Q}$$

Thus, there is conventionally a trade-off between the signal amplitude that can be obtained from the single-peak resonant structure with a given amount of power injection, and the bandwidth over which the system will resonate.

Figure 4:
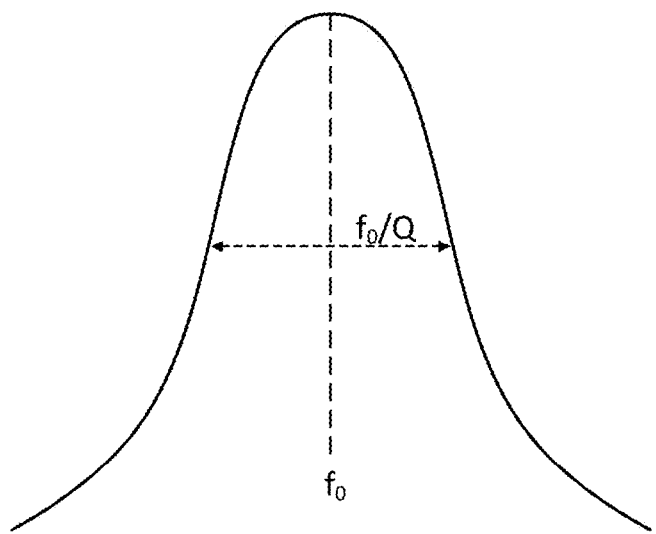
FIG. 4 is a frequency response of the conventional clock distribution network of FIG. 3 having only a single fundamental resonant frequency.

However, the power consumption benefit provided by known resonant clock distribution networks operating at only one single fundamental frequency limits the usefulness of such known clock distribution networks in multi-rate applications. Since the line is designed to resonate at a single fundamental resonance, the small range of bandwidth over which the clock distribution can be used will cause clock signal frequencies outside the bandwidth to have lower output voltage, as shown in FIG. 4. These known clock distribution networks require more power be injected at frequencies that are off-resonance.

In contrast, an example embodiment of the present disclosure seeks to solve the problem of narrow-band resonance by providing a multi-peak, or double-peak, resonant structure based on a combination of a multi-port electrical network and the transmission line. As will be described in further detail below, according to an example embodiment, by using the multi-port electrical network in combination with the transmission line, two distinct modes of resonance are generated and placed close together to create a bandpass response. Using this method, a resonant clock distribution network can be created that works for a wide range of frequencies. Advantageously, in some embodiments, the resonant clock distribution network requires no additional tuning with extra components.

Figure 5:
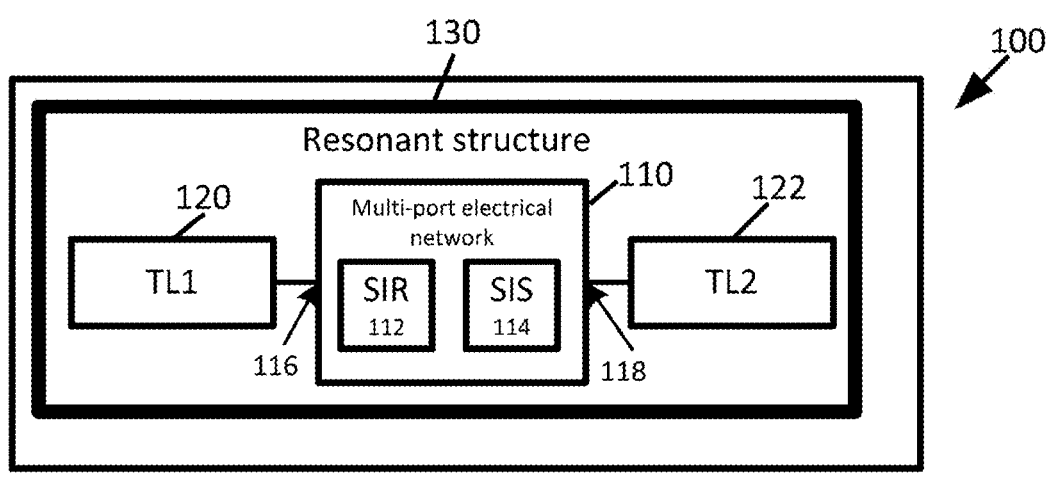
FIG. 5 is a block diagram of a clock distribution network according to an embodiment of the present disclosure.

FIG. 5 is a block diagram of a clock distribution network according to an embodiment of the present disclosure. In an embodiment, a wideband clock distribution network 100, such as shown in FIG. 5, provides a multi-port electrical network 110 in combination with a transmission line including segments 120 and 122 to create a multi-resonant structure 130 having a bandpass response extending across a plurality of clock distribution frequencies within a bandwidth. This bandpass response allows the clock distribution network 100 to be used in different applications relating to a wide range of frequencies across which the clock distribution network 100 still obtains power savings that were previously only available at a single frequency in the implementations found in known approaches.

In an example embodiment, the transmission line is configured to distribute a high speed clock signal, and comprises first and second transmission line segments 120 and 122, each having a source end and a load end. In an example embodiment, the multi-port electrical network 110 is coupled between the load end of the first transmission line segment 120 and the source end of the second transmission line segment 122. The multi-port electrical network 110 and the transmission line cooperate to create the multi-resonant structure 130.

The multi-port electrical network 110, comprises a series inductive reactance (SIR) 112 and a shunt inductive susceptance (SIS) 114 configured to create a first low-frequency resonance and a second higher-frequency resonance. The first and second resonances cooperate to create a bandpass response across a plurality of clock distribution frequencies associated with a bandwidth of the resonant structure 130.

In an example embodiment, such as shown in FIG. 5, the multi-port electrical network 110 comprises a two-port electrical network having first and second ports 116 and 118. In an example embodiment, the multi-port electrical network 110 comprises a passive electrical network. In an example embodiment, the passive electrical network consists of only passive devices that do not inject energy into the system, for example one or more of: resistor, capacitor, or inductor. Such passive elements only present a frequency-dependent, complex impedance to the external transmission lines connected to the ports of the electrical network. In an example embodiment, the multi-port electrical network comprises a two-port passive network, or a three-element inductive network. In an example embodiment, the multi-port electrical network comprises a plurality of electrical components or devices.

In many example embodiments as described herein, the multi-resonant structure 130 comprises a dual-resonant structure having two resonances. In another embodiment, properties of the multi-port electrical network 110 and the transmission line segments 120 and 122 are modified to generate more than two resonances. The specific details of such an embodiment are omitted herein since, as known to one skilled in the art, the order of the passive network can be increased by including more passive elements in the multi-port electrical network. These extra elements add more degrees of freedom to the design of the electrical network which can be used to modify the frequency-dependent complex impedance seen by the transmission lines connected at each of the ports. By adding more series and shunt impedances in the electrical network a plurality of resonances can be created, increasing the bandwidth of the clock distribution network.

Figure 6:
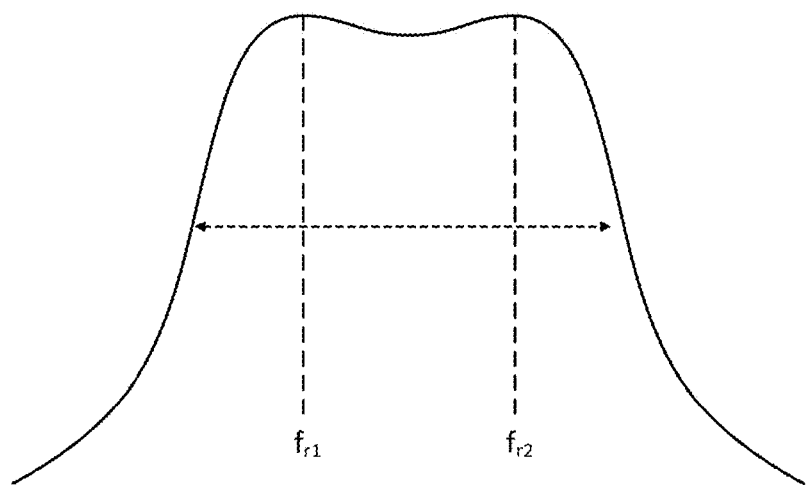
FIG. 6 is a frequency response of the clock distribution network of FIG. 5 showing a wideband, or multi-resonant, response.

FIG. 6 shows an example of a wideband bandpass response of the clock distribution network of FIG. 5. The response comprises a first peak at a first resonant frequency, $f_{r1}$, and a second peak at a second resonant frequency, $f_{r2}$. Referring to both FIGS. 5 and 6, in an example embodiment, the transmission line and the series inductive reactance 112 cooperate to create the second high-frequency resonance, $f_{r2}$, and the transmission line and the shunt inductive susceptance 114 cooperate to create the first low-frequency resonance, $f_{r1}$. As is known to one skilled in the art, in an example embodiment where the multi-port electrical network comprises a passive electrical network, the equivalent impedance of the passive electrical network will vary with frequency. The value of each of the passive elements in the network do not change (e.g. the inductor still has a value of 1 nH), but the equivalent impedance of each of the passive elements will change with frequency.

Referring back to FIG. 5, in an example embodiment, the series inductive reactance 112 and the shunt inductive susceptance 114 have a first inductive reactance value and a first inductive susceptance value, respectively, at a first frequency, for example $f_{r1}$, associated with the first low-frequency resonance. The series inductive reactance 112 and the shunt inductive susceptance 114 have a second different inductive reactance value and a second series inductive susceptance value, respectively, at a second frequency, for example $f_{r2}$, associated with the second higher-frequency resonance. The first low-frequency resonance is influenced by the first inductive reactance value and the first inductive susceptance value as well as reactance values of the first and second transmission line segments at the first frequency. However, the second higher-frequency resonance is only influenced by the second series inductive reactance value and the reactance values of the first and second transmission line segments at the second frequency.

In other words, in an example embodiment, the series inductive reactance and the shunt inductive susceptance have different values at the different frequencies, and the shunt inductive susceptance does not influence the second higher-frequency resonance and becomes invisible to the circuit at that resonance.

In another example embodiment, the series inductive reactance 112 and the shunt inductive susceptance 114 cooperate to produce high-impedance at both ends of transmission line. To described this embodiment in further detail, at the first low-frequency resonance, the series inductive reactance 112 and the shunt inductive susceptance 114 cooperate with the first and second transmission line segments 120 and 122 to produce a high-impedance at the source end of the first transmission line segment 120 for optimal power injection and to produce a high impedance at the load end of the second transmission line segment 122 for a maximum clock voltage output. At the second higher-frequency resonance, the series inductive reactance 112 cooperates with the first and second transmission line segments 120 and 122 to produce a high-impedance at the source end of the first transmission line segment 120 for optimal power injection and to produce a high-impedance at the load end of the second transmission line segment 122 for a maximum clock voltage output.

In an example embodiment, the multi-port electrical network is connected to a low impedance path, such as an effective ground. In an example embodiment, the multi-port electrical network is composed of one or more metal layers, such as top layer or top level metals, in integrated circuit technology, which is easy to implement.

In an example embodiment, the first and second transmission line segments 120 and 122 have substantially equal lengths, and the multi-port electrical network 110 is provided between the substantially equal lengths of transmission line. In another example embodiment, the first transmission line segment 120 has a first length, and the second transmission line segment 122 has a second length, the second length being different from the first length.

In different embodiments, the multi-port electrical network 110 can be implemented as a transformer, or as an assembly of connected inductors.

Figure 7:
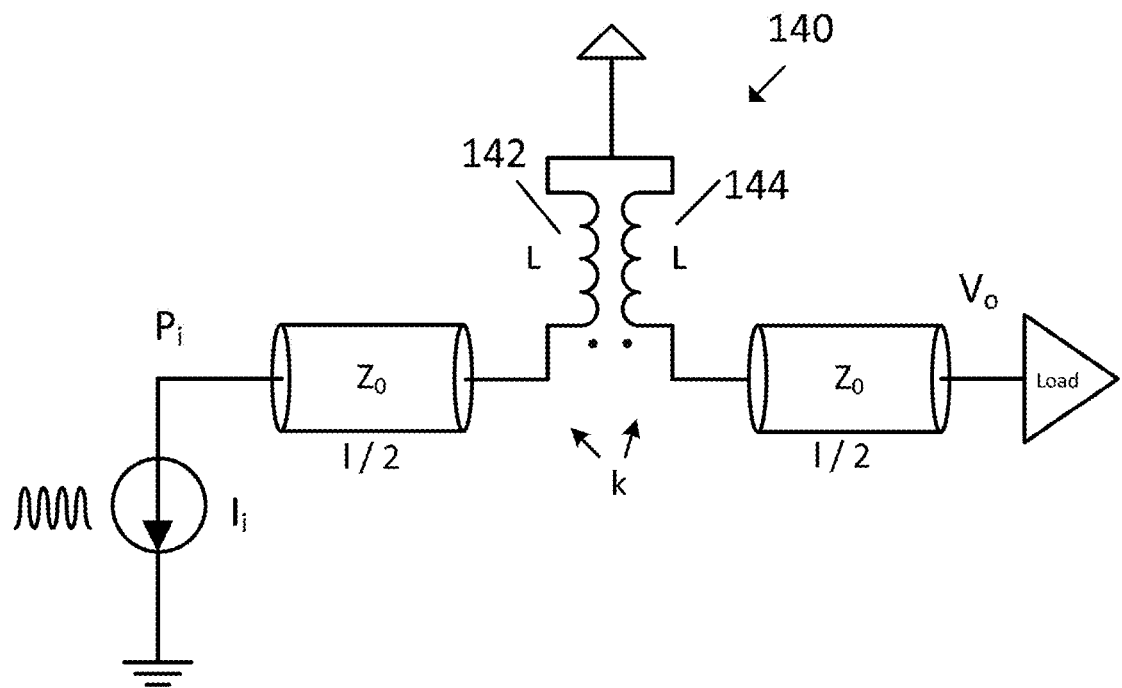
FIG. 7 is a circuit diagram of a clock distribution network including a transformer according to an embodiment of the present disclosure.

FIG. 7 is a circuit diagram of a clock distribution network having a transformer according to an embodiment of the present disclosure. In the embodiment of FIG. 7, the multi-resonant circuit comprises a transformer 140 having primary and secondary magnetically coupled inductive elements 142 and 144 in a center-tapped configuration. In the example embodiment of FIG. 7, the primary and secondary magnetically coupled inductive elements 142 and 144 each have the same inductance L, and are related by a positive coupling coefficient k.

In the example embodiment of FIG. 7 having a symmetric transformer where both inductors have equal values L, the first and second transmission line segments 120 and 122 have substantially equal lengths, and the multi-resonant circuit 110 is provided between the substantially equal lengths of transmission line. For example, if the total transmission line length, or overall distance from the source to the load, is "1", then the length of each of the first and second transmission line segments 120 and 122 is "½" in this example embodiment. For ease of explanation and clarity, the examples described herein in detail represent the more common configuration of a symmetric transformer with equal L values.

In an alternative example embodiment having an asymmetric transformer with different primary and secondary inductance values $L_1$ and $L_2$, the first transmission line segment 120 has a first length, and the second transmission line segment 122 has a second length, the second length being different from the first length. In such an example embodiment, the values of $L_1$ and $L_2$ are selected with different values that compensate for the different transmission line lengths, or for any asymmetry in the two transmission line segments.

Figure 15:
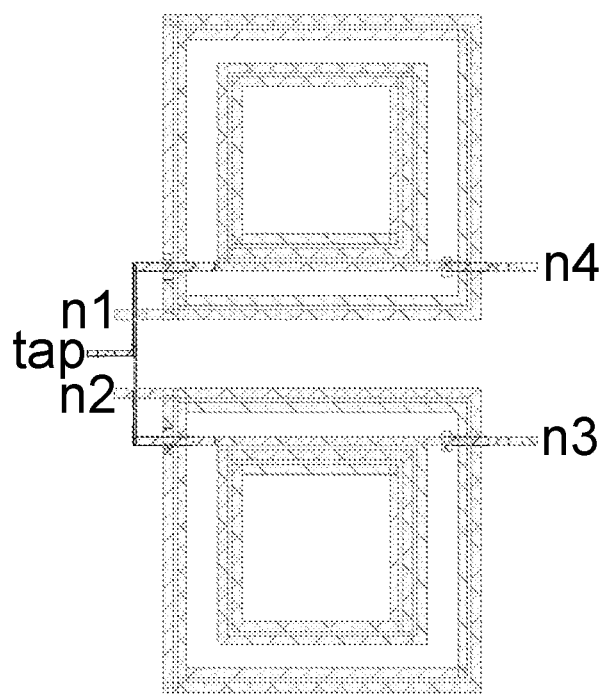
FIG. 15 illustrates an example embodiment of an integrated circuit implementation of a multi-resonant structure according to a transformer-based differential clock distribution network having negative coupling between the differential halves.

As will be described below, in an example embodiment when using positive coupling (k>0), the circuit shown in FIG. 7 is used to generate two closely spaced resonances that create a resonant structure with a bandpass response. In an example embodiment, such as shown in FIG. 15, with a center frequency of 28 GHz, the resonances are separated by about 6 GHz (+−3 GHz around the center frequency), which yields an overall bandwidth of the structure of around 13 GHz, which is very wide. Referring back to FIG. 7, in this implementation, the coupling co-efficient between two inductors can be calculated from the mutual inductance as:

$$k_{12} = \frac{M_{12}}{\sqrt{L_1 L_2}}$$

where $M_{12}$ is the mutual inductance between the two inductors with value $L_1$ and $L_2$. In the example embodiment of FIG. 7, $L_1$ and $L_2$ have substantially equal values L.

Consider a spacing between first and second frequencies $f_{r1}$ and $f_{r2}$ associated with the first low-frequency resonance and the second higher-frequency resonance, respectively, as shown in FIG. 6. In an example embodiment, this spacing between $f_{r1}$ and $f_{r2}$ is adjustable to modify the bandpass response based on adjustment of a mutual inductance value $M_{12}$ of the primary and secondary inductors in the transformer, or based on adjustment of the inductance L of the primary and secondary inductors in the transformer.

Consider an example embodiment in which the multi-port electrical network 110 comprises a transformer 140 having primary and secondary magnetically coupled inductive elements 142 and 144 in a center-tapped configuration. In this example embodiment, the primary inductive element 142 has a first terminal connected to the load end of the first transmission line segment 120 and has a second terminal connected to a low impedance node equivalent to ground. Also in this embodiment, the secondary inductive element 144 has a first terminal connected to the source end of the second transmission line segment 122 and has a second terminal connected to the low impedance node.

Figure 8:
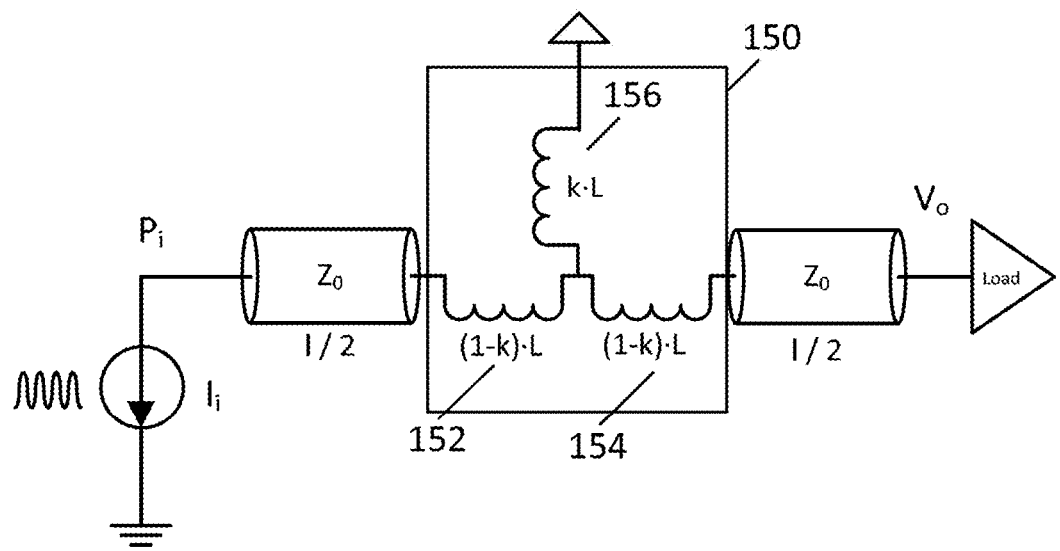
FIG. 8 is a circuit diagram of a clock distribution network including a double-series, shunt peaking circuit according to an embodiment of the present disclosure. The double-series, shunt peaking circuit may also be an equivalent circuit used for analyzing the transformer of FIG. 7.

FIG. 8 is a circuit diagram of a clock distribution network having a circuit 150 according to an embodiment of the present disclosure. In an embodiment, the circuit 150 is an equivalent circuit used for analyzing the transformer 140 of FIG. 7, which in this example embodiment is a symmetric transformer with two equal inductance values L. In another embodiment, the circuit 150 is an alternate embodiment including the three inductors configured as illustrated, rather than the transformer of FIG. 7.

In FIG. 8, the transformer of FIG. 7 has been replaced by its common equivalent of three individual inductors in a tee configuration. Using this configuration with positive coupling (k>0), two resonances are created that can be separated from one another by selecting an appropriate value of k, and centered upon a desired frequency by properly selecting a value of L, in relation to the value of L in FIG. 7.

In an embodiment, the series inductive reactance 112 of the multi-port electrical network in FIG. 5 corresponds in FIG. 8 to a series inductance having a value defined by (1−k)·L. In an embodiment, the shunt inductive susceptance 114 of the multi-port electrical network in FIG. 5 corresponds in FIG. 8 to a shunt inductance having a value defined by k·L.

It is worth noting that the terms "inductance" and "reactance" have different meanings as used in this disclosure. Inductance is the value of the inductor and does not depend on frequency (and is measured in Henrys); reactance depends on both the value of the inductance and on the frequency through the equation X=L*2*pi*f where L=inductance, pi=3.14159, f=frequency in Hz. So, in FIG. 8, the value of the inductance is being set, which then has a reactance that varies with frequency and hence leads to the two resonances.

The circuit 150 in FIG. 8 is an example embodiment of the multi-port electrical network 110 in which the series inductive reactance 112 comprises first and second series inductors 152 and 154, and the shunt inductive susceptance 114 comprises a shunt inductor 156.

Referring to both FIGS. 5 and 8, in an example embodiment, the circuit 150 comprises a double-series, shunt peaking circuit comprising: a first series inductor 152 coupled to the load end of the first transmission line segment 120; a second series inductor 154 coupled to the source end of the second transmission line segment 122; and a shunt inductor 156 coupled between first series inductor 152 and the second series inductor 154.

Figure 9:
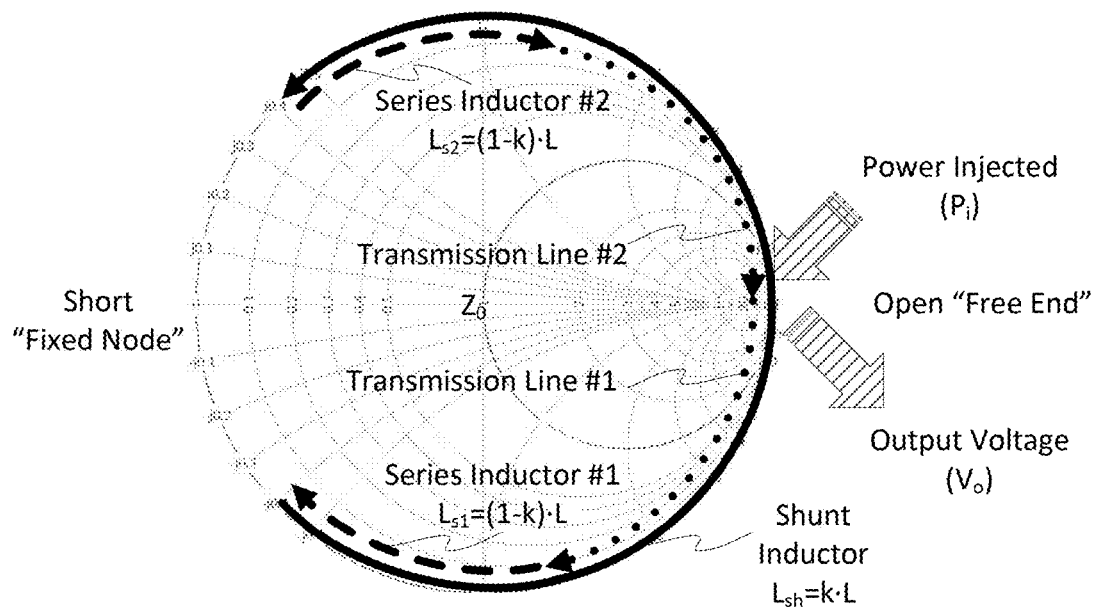
FIG. 9 is a diagram of a Smith chart showing various impedances in the clock distribution network of FIG. 7 with respect to a first resonant frequency, as the network is traversed from one end to the other and different circuit components are encountered.
Figure 10:
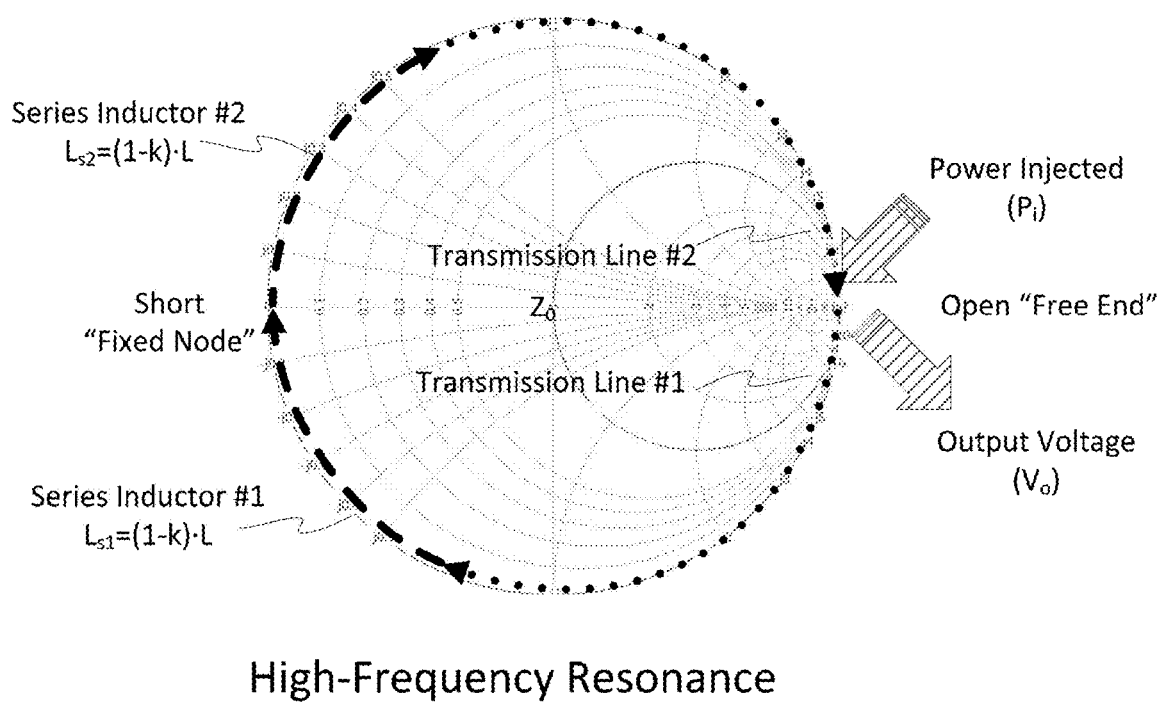
FIG. 10 is a diagram of a Smith chart showing various impedances in the clock distribution network of FIG. 7 with respect to a second resonant frequency, as the network is traversed from one end to the other and different circuit components are encountered.

A discussion will now be presented in relation to FIGS. 9 and 10 to provide additional details and analysis of embodiments of the present disclosure, such as FIGS. 5-8 and other embodiments that follow. This discussion provides further insight into how enhanced performance and power savings are obtained for a bandpass response across a plurality of clock distribution frequencies associated with a bandwidth of the resonant structure. The plurality of frequencies include first and second frequencies corresponding respectively to a low-frequency resonance, described in relation to FIG. 9, and a high-frequency resonance, described in relation to FIG. 10.

FIG. 9 shows, via Smith chart analysis, various impedances in the clock distribution network 100 of FIG. 7 in relation to the first resonant frequency (corresponding to the low-frequency resonance), as the network is traversed from one end to the other and different circuit components are encountered.

The design of a resonant clocking structure, such as the resonant structure 130 of FIG. 5, is primarily dictated by: the distance between the source driver and load; the frequency of operation; and the propagation constant of the transmission line. In general, the material properties and geometry of the line cannot be changed, which limits the frequency of operation to integer multiples of half wavelengths. To support arbitrary frequencies, reactive element(s) are often added in shunt or series to electrically shorten or lengthen the line. Which resonant mode is excited depends on where and how these discrete reactive elements are placed along the line.

A transmission line is inherently an impedance transformer. The impedance looking into the source end of the line will depend on the load, but also the frequency and length of the line. A convenient way to analyze the impedance (Z) is with a Smith chart, which plots the reflection co-efficient (Γ) in terms of normalized impedance (Z/Zo):

$$\Gamma = \frac{1 - \frac{Z}{Z_0}}{1 + \frac{Z}{Z_0}}$$

When plotted on the Smith chart, the analysis of the periodic nature of transmission line impedance is much more instructive. Any standing-wave resonator built on a transmission line using series and shunt reactive circuit elements will correspond to a continuous path on the Smith chart. This is the case, for example, with the general embodiment in FIG. 5 in which the multi-resonant circuit 110 is built on a transmission line having segments 120 and 122 and comprises a series inductive reactance 112 and a shunt inductive susceptance 114.

Consider the specific example of FIG. 8 in relation to the Smith chart analysis. Assuming ideal components with zero loss, an inductor added in series or shunt will move the impedance path either clockwise or counter-clockwise. A series inductor, such as series inductors 152 and 154, will move the impedance clockwise and electrically lengthen the line, while a shunt inductor 156 will move the impedance curve counterclockwise and electrically shorten the line. Conversely, a capacitance which has a negative reactance will have the opposite effect. A series capacitor will electrically shorten the line, while a shunt capacitor will electrically lengthen the line. (This is simply mentioned for completeness, since embodiments described herein have no series capacitor.) A transmission line traversed from source to load will make a clockwise 180 degree rotation for every ¼ wavelength when the Smith chart is normalized to the line characteristic impedance. Assuming a lossless transmission line (r≈0), the impedance curve will trace out a curve clockwise on the outer circumference of the Smith chart as shown.

The Smith chart is also instructive for analyzing the power efficiency of the clock distribution network.

In the embodiments of FIGS. 7 and 8, the power source is modelled as a current source $I_i$, and thus, the real power delivered to the resonant system at resonance is equal to:

$$P_i = \frac{1}{2}\Re\ (I_i^2 Z)$$

where Z is the complex impedance looking into the system at the point where the power source meets the transmission line. At resonance, the power dissipated in the resonant structure will be equal to the power injected:

$$P_i = P_{osc}$$

where $P_{osc}$ is the power dissipated in the resonant structure due to the finite Q-factor of the inductor and loss in the transmission line. Thus, the larger the power that is injected into the system, the larger the amplitude of oscillation at resonance.

Similarly, the voltage at the output of the line will also be related to the impedance at the end of the line ($Z_L$) and the current at resonance in the transmission line ($I_{TL}$):

$$V_o = I_{TL} Z_L$$

Therefore, to obtain the optimum power injection from the current source into the resonant system and the largest output voltage, the impedance seen at the source end of the transmission line and the load end of the transmission line is preferably maximized. Referring to the Smith chart shown in FIG. 9, this means that, where power is injected into the clock distribution network, the impedance should optimally be at or close to the right-hand side (i.e., 3 o'clock) of the Smith chart; and where the output voltage is measured, the impedance should also be at or close to the right-hand side (i.e., 3 o'clock) of the Smith chart.

In an embodiment, the first lower-frequency resonance is created by the equivalent shunt-path 156, corresponding to the shunt inductive susceptance of the transformer, as shown in FIG. 9. Starting at the source end and passing through half of the transmission line (#1) rotates the impedance clockwise on the Smith chart. From here the equivalent series inductance 152 of $L_{s1}$ causes a further clockwise rotation towards the "short" end of the real impedance axis. The added equivalent shunt impedance 154 of $L_{sh}$, however, then rotates the path counter-clockwise and around to the positive imaginary axis. At this point, since in the example being considered the transformer is symmetric, the added series inductor $L_{s2}$ and transmission line rotates back to the "open" end as desired. Thus, this resonance achieves the desired goal of having a high-impedance at the source end for optimal power injection, and a high impedance at the load end of the line leading to large output voltage.

FIG. 10 shows, via Smith chart analysis, various impedances in the clock distribution network of FIG. 7 (and the equivalent circuit of FIG. 8) in relation to the second resonant frequency, as the network is traversed from one end to the other and different circuit components are encountered.

The second high-frequency resonance is created by the series inductances 152 and 154 only. This is because a second path from the "open" to "open" end of the Smith chart is designed to fully traverse the whole circumference in a clockwise rotation as shown in FIG. 10. In this case, starting from the source end, the first transmission line segment 120 and the first equivalent series inductor 152 move the path on the Smith chart from the "open" end to "short" end. Since the impedance is already a "short", adding the shunt inductance 156 does not contribute any more rotation. At this point, the other equivalent series inductance 156 of $L_{s2}$ and the rest of the transmission line 122 takes the impedance curve back to the "open" end as desired. Note that, in an example embodiment with equal lengths of first and second transmission line segments 120 and 122, for these rotations to work, the transformer has a symmetric turns ratio between primary and secondary inductive elements and has positive coupling. In an alternate embodiment, the primary and secondary inductance values are modified to compensate for any asymmetry in the two transmission line segments. With realistic values of Q for the transformer and transmission line, frequencies in between these two resonances will still have a high-enough impedance to create a bandpass response as shown in FIG. 6.

Although the multi-resonant circuit may be achieved according to a variety of specific implementations, various general structures are described and illustrated herein as embodying example implementation approaches of the present disclosure. These embodiments are general examples only and certain additions or modifications to the example embodiments may be effected by the skilled person without departing from the scope of the present disclosure. Furthermore, as would be known to the skilled person, specific values of inductance and resistance may be chosen for individual circuit elements in order to meet specific circuit design criteria, including achieving the wideband response of FIG. 6.

Up until this point, the described embodiments of the present disclosure have been shown in their "single-ended" form. In many clock distribution applications, it is desirable to employ a fully differential structure where both a clock signal and its inverted complement are transmitted at the same time.

Figure 11:
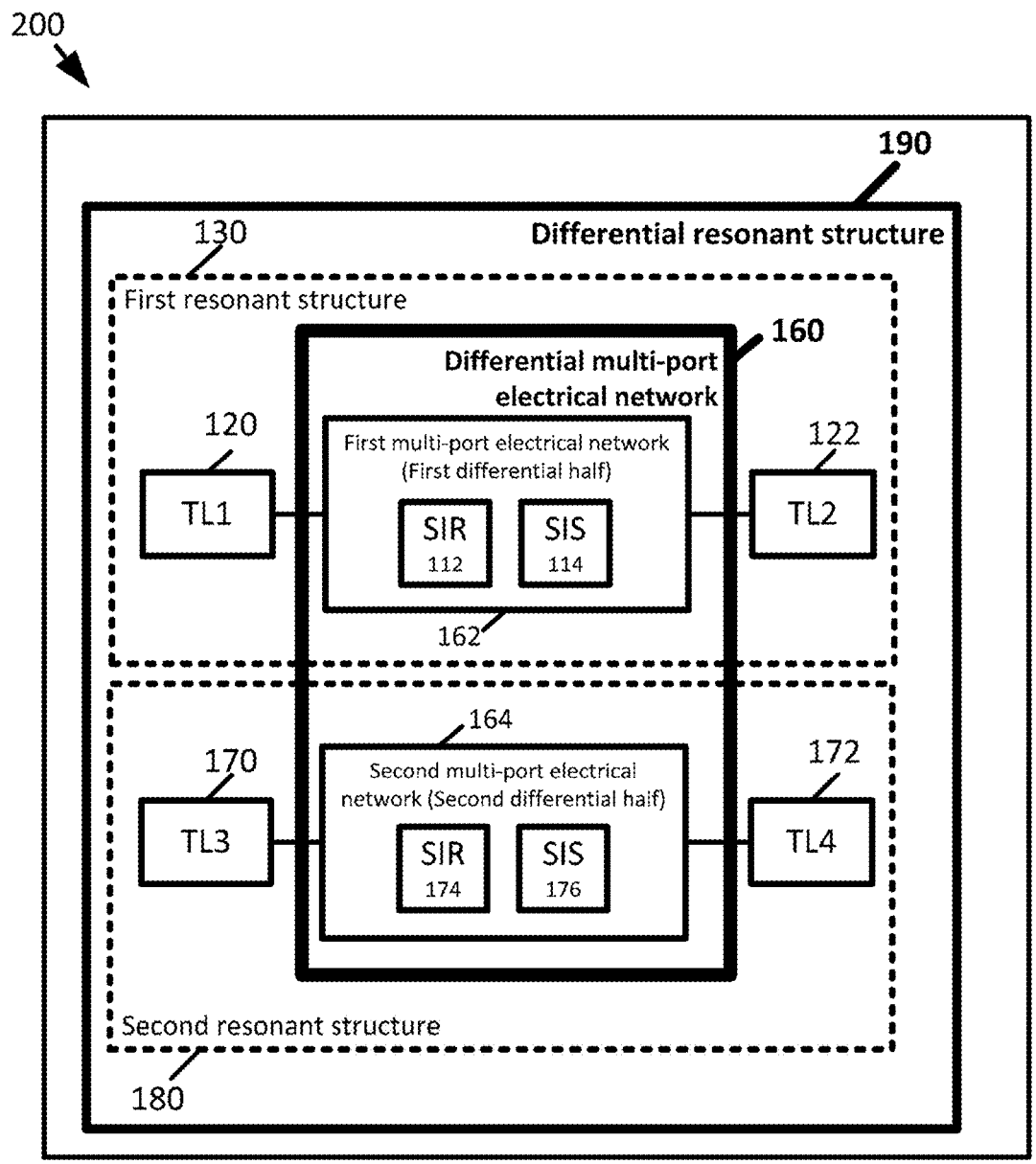
FIG. 11 is a block diagram of a clock distribution network according to another embodiment of the present disclosure.

FIG. 11 is a block diagram of a clock distribution network 200 according to a differential embodiment of the present disclosure including a differential multi-port electrical network 160 including first and second differential halves 162 and 164. The differential multi-port electrical network 160, in combination with first and second transmission lines, cooperate to create a differential resonant structure 190.

In the example embodiment of FIG. 11, the multi-port electrical network 110 described earlier in relation to one or more of the single-ended implementations is called a first multi-port electrical network 162 and includes the equivalent series inductive reactance 112 and shunt inductive susceptance 114. The first multi-port electrical network 162 operates in relation to the first transmission line, including first and second transmission line segments 120 and 122.

The clock distribution network in FIG. 11 comprises a differential multi-port electrical network 160 comprising a first differential half 162 and a second differential half 164. In an example embodiment, the differential multi-port electrical network comprises a four-port electrical network, such as a four-port passive electrical network. The first differential half 162 comprises the first multi-port electrical network described earlier in the single-ended implementation, such as the multi-port electrical network 110 of FIG. 5.

The second transmission line has third and fourth transmission line segments 170 and 172 each having a source end and a load end. The second differential half 164 of the differential multi-port electrical network is coupled between the load end of the third transmission line segment 170 and the source end of the fourth transmission line segment 172. The second differential half 164 and the third and fourth transmission line segments 170 and 172 cooperate to create a second resonant structure 180. In an example embodiment, the second resonant structure comprises a complementary resonant structure, which is complementary to the first resonant structure created by the first differential half 162 and the first and second transmission line segments 120 and 122. The first resonant structure 130 and the second resonant structure 180 together form, or cooperate to create, the differential resonant structure 190.

The second differential half 164 of the differential multi-port electrical network comprises a second series inductive reactance 174 and a second shunt inductive susceptance 176 configured to influence the creation of the first low-frequency resonance and the second higher-frequency resonance. These are the same resonances created by the series inductive reactance 112 and the shunt inductive susceptance 114. The first and second resonances cooperate to create the same bandpass response across the second resonant structure 180 as the bandpass response across the first resonant structure 130, which can be described as creating the bandpass response across the differential resonant structure 190.

Figure 12:
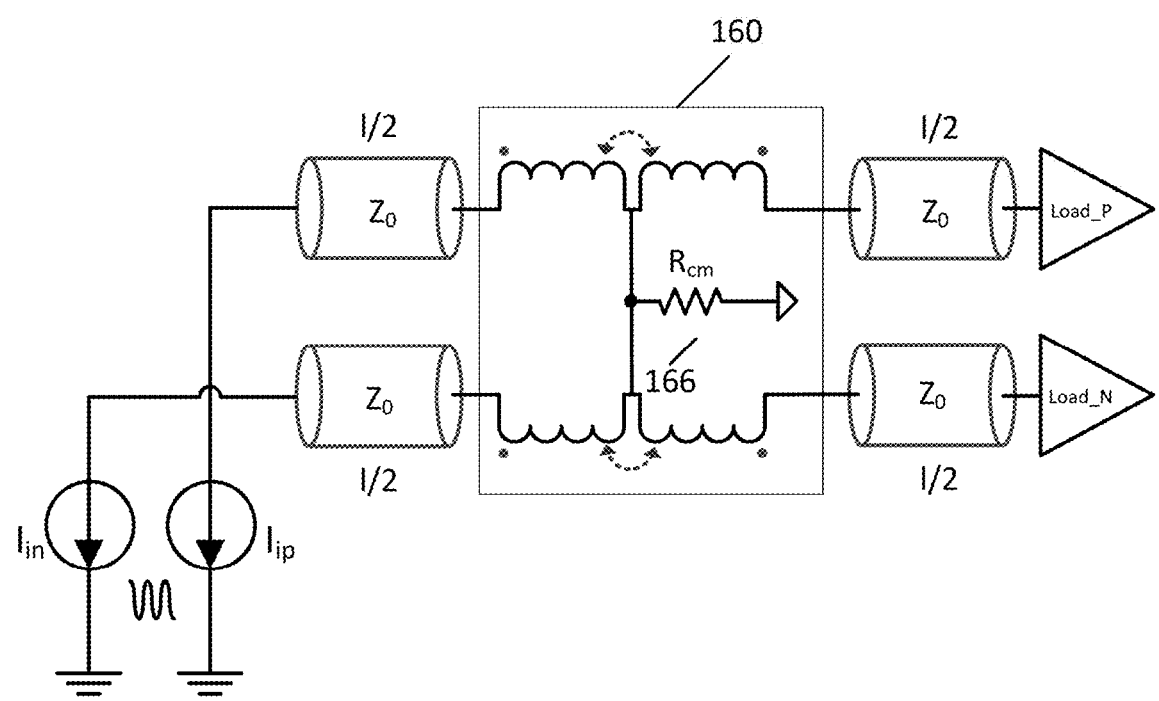
FIG. 12 is a circuit diagram of a transformer-based differential clock distribution network according to an embodiment of the present disclosure.

FIG. 12 is a transformer-based differential clock distribution network according to an embodiment of the present disclosure. The embodiment of FIG. 12 can be described as comprising two coupled transformers, or two separate transformers. The embodiment of FIG. 12 can be alternatively described as two coupled pairs of coupled inductors, or two separate pairs of coupled inductors. In the discussion below, the elements between current-mode driver $I_{ip}$ and Load_P will be referred to as a first transmission line configured to transmit a first high speed clock signal, and the elements between current mode driver $I_{in}$ and Load N will be referred to as a second transmission line configured to transmit a second high speed clock signal. In another embodiment, the descriptions of the two different transmission lines are switched with one another. The second transmission line is configured to distribute a second high speed clock signal, where the second high speed clock signal is a complement of the first high speed clock signal.

The differential multi-port electrical network 160 of FIGS. 11 and 12 will now be described in further detail with respect to an example embodiment of FIG. 13.

Figure 13:
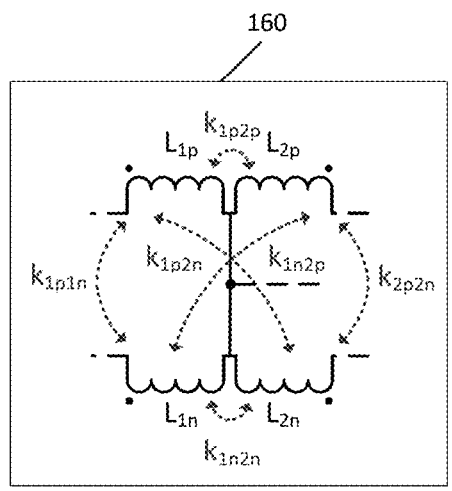
FIG. 13 illustrates a differential multi-port electrical network, such as a differential transformer used in relation to the clock distribution network of FIG. 12, showing the different mutual coupling between terminals according to an embodiment of the present disclosure.

FIG. 13 illustrates a differential multi-port electrical network 160, such as a differential transformer used in relation to the clock distribution network of FIG. 12, showing the different mutual coupling between terminals according to an embodiment of the present disclosure. In an example embodiment, the differential multi-port electrical network 160 of FIG. 13 comprises a magnetically coupled passive electrical network. Since FIG. 13 illustrates a differential implementation, there are now four magnetically coupled inductors which form a differential transformer with coupling coefficients as shown in an example embodiment of FIG. 13. As shown in FIG. 12, the differential multi-port electrical network 160 of FIGS. 12 and 13 also comprises a resistor 166 at the center-point of the differential structure to set the common-mode voltage. Note that this resistor 166 does not show up in the differential path since it is connected to AC-ground, and thus does not affect the differential mode response. In the differential mode implementation according to an example embodiment, each of the inputs is composed of a differential and common mode current signal:

$$I_{ip} = \frac{I_{icm} + I_{idm}}{2}$$

$$I_{in} = \frac{I_{icm} - I_{idm}}{2}$$

where, $I_{icm}$ is the input signal common-mode current, while $I_{idm}$ is the differential mode clock signal. Using the center tapped resistor 166 at the AC-ground point sets the DC voltage output common-mode at:

$$V_{ocm} = I_{icm} R_{cm}$$

Note that the common-mode voltage can be referenced to either ground or supply-voltage, depending on what works better with subsequent circuitry. Also, even though the embodiment described in the following description uses current-mode power injection, in another embodiment the approach is extended to voltage-mode excitation by removing the resistor 166 $R_{cm}$, and replacing the current mode driver with a voltage mode driver such as a CMOS inverter.

There are advantages of the differential configuration over the single-ended implementation. Firstly, a differential structure inherently rejects common-mode supply noise. Secondly, the mutual coupling between P/N for both the primary and secondary inductors ($k_{1p1n}$ and $k_{2p2n}$) increases the overall inductance for a given area, reducing the area overhead for implementing the additional transformers. Thirdly, the cross-coupling ($k_{1p2n}$ and $k_{1n2p}$) increases the effective coupling between the primary and secondary inductive elements of each of the two transformers. As described previously and shown in FIG. 9 and FIG. 10, increasing the coupling between the primary and secondary inductive elements inside the transformer increases the bandwidth of the passband of the resonant structure.

Figure 14:
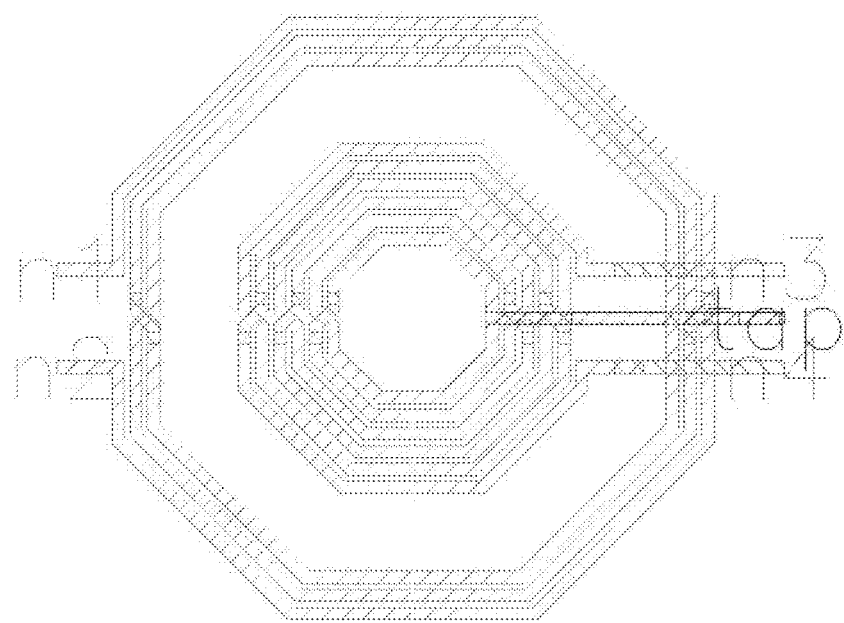
FIG. 14 illustrates an example embodiment of an integrated circuit implementation of a multi-resonant structure according to the transformer-based differential clock distribution network of FIG. 13.

FIG. 14 illustrates an example embodiment of an integrated circuit implementation of a multi-port electrical network according to the transformer-based differential clock distribution network of FIG. 13. FIG. 14 illustrates an example implementation of a fully integrated differential transformer. In the embodiment of FIG. 14, the magnetic coupling between the differential ports (n1/n2) shows positive mutual coupling ($k_{1p2n}>0$, $k_{1n2p}>0$, $k_{1p1n}>0$, $k_{2p2n}>0$). An embodiment comprising positive mutual coupling between the two sides of the differential structure, such as shown in FIG. 14, creates a more compact implementation.

FIG. 15 illustrates an example embodiment of an integrated circuit implementation of a multi-port electrical network according to a transformer-based differential clock distribution network having negative coupling between the differential halves. In the embodiment as shown in FIG. 15, negative coupling ($k_{1p2n}<0$, $k_{1n2p}<0$, $k_{1p1n}<0$, $k_{2p2n}<0$) is used with no loss of functionality of the resonant structure. In this case, the two differential halves of the transformer interact to lower the inductance. Physically spacing the inductors apart can help mitigate this effect, though such physical spacing can be undesirable with respect to expanding circuit size on the integrated circuit. In an example implementation, the embodiment of FIG. 15 is used to take advantage of the fact that the two separate transformers have a higher self-resonant frequency and thus, can be used at much higher frequencies, at the expense of integrated circuit area.

In the example embodiment of a differential transformer with negative coupling as shown in FIG. 15, two single-ended transformers are mirrored about a central axis to create a differential structure, with the center tap tied together. A primary advantage in this example design is that due to the lower capacitive coupling between the differential halves (P/N), the self-resonant frequency of the design is much higher. This allows the design to be used at very high frequencies, at the expense of a larger implementation area. Regardless of the sign of the differential coupling between P/N ($k_{1p2n}$, $k_{1n2p}$, $k_{1p1n}$, $k_{2p2n}$), the transformer coupling between primary and secondary is always positive ($k_{1p2p}$>0, $k_{1n2n}$>0) to maintain the pass-band resonance feature that is characteristic of, and common to, embodiments of the present disclosure.

Figure 16:
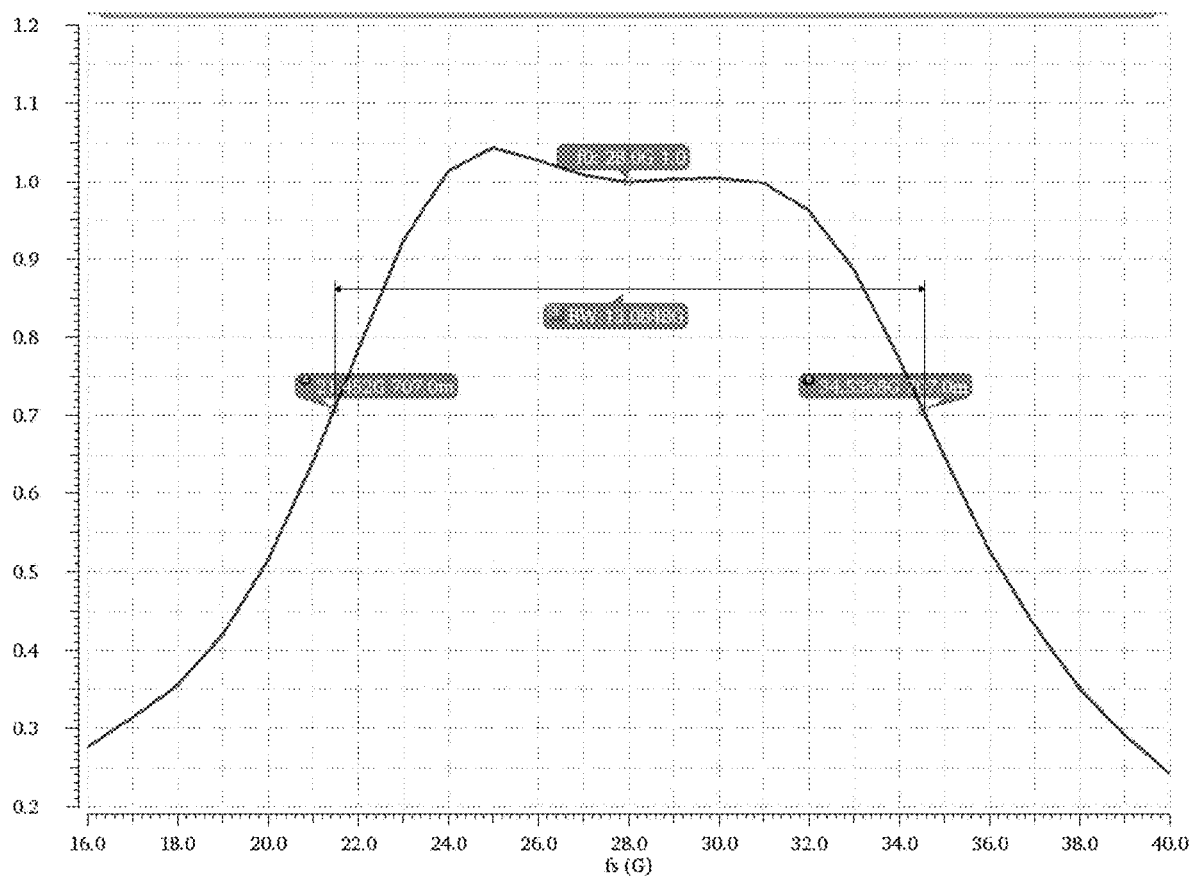
FIG. 16 is a graph of a simulated, normalized output voltage amplitude frequency response of a clock distribution network according to an embodiment of the present disclosure.

FIG. 16 is a graph of a simulated, normalized output voltage amplitude frequency response of a clock distribution network according to an embodiment of the present disclosure. In this example, a differential resonant structure is designed to resonate for a clock at 28 GHz. This example uses a total transmission line length of 600 um, with a 50 ohm impedance. The symmetric transformer used has a 600 pH primary and secondary inductance with a coupling factor of k=0.4. In this specific example, all components were simulated using S-parameter models generated with an EM solver to ensure that realistic high-frequency loss was included. Even though the inductors used in this example design have a Q<10 @ 28 GHz, significant power savings can still be obtained over a traditional CMOS architecture.

Figure 17:
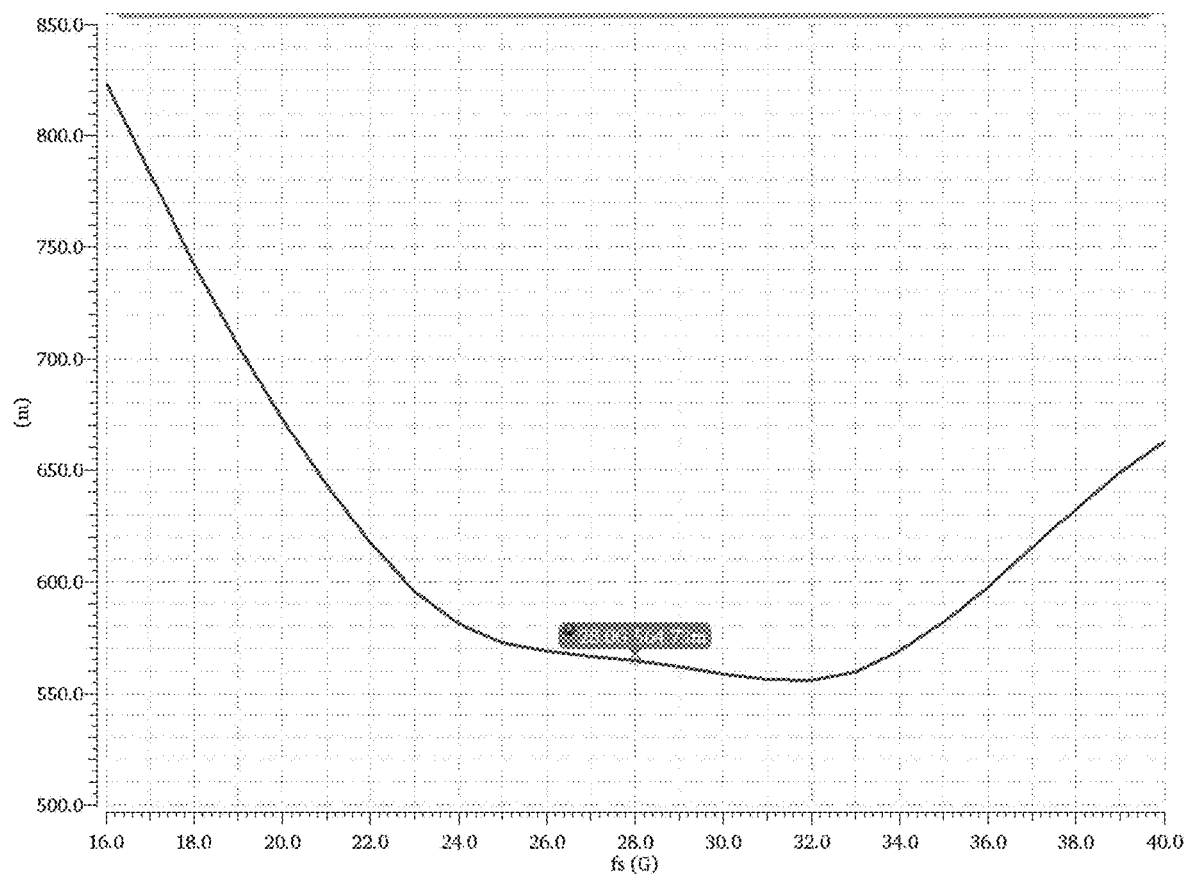
FIG. 17 is a graph of a power savings frequency response of the clock distribution network according to an embodiment of the present disclosure.

The relative power compared to a baseline case (FIG. 2), with the same transmission line and 300Ω termination is shown in FIG. 17. In other words, FIG. 17 is a graph of a power savings frequency response of the clock distribution network according to an embodiment of the present disclosure. In this example, with realistic loss included in the transmission line, the power of the resonant structure relative to the baseline is around 0.58, or a power savings of over 40%. Note that this is just an example, and the power savings can exceed this number by using higher-Q inductors. In this case, the tradeoff would be larger implementation area to obtain the higher power savings.

Figure 18:
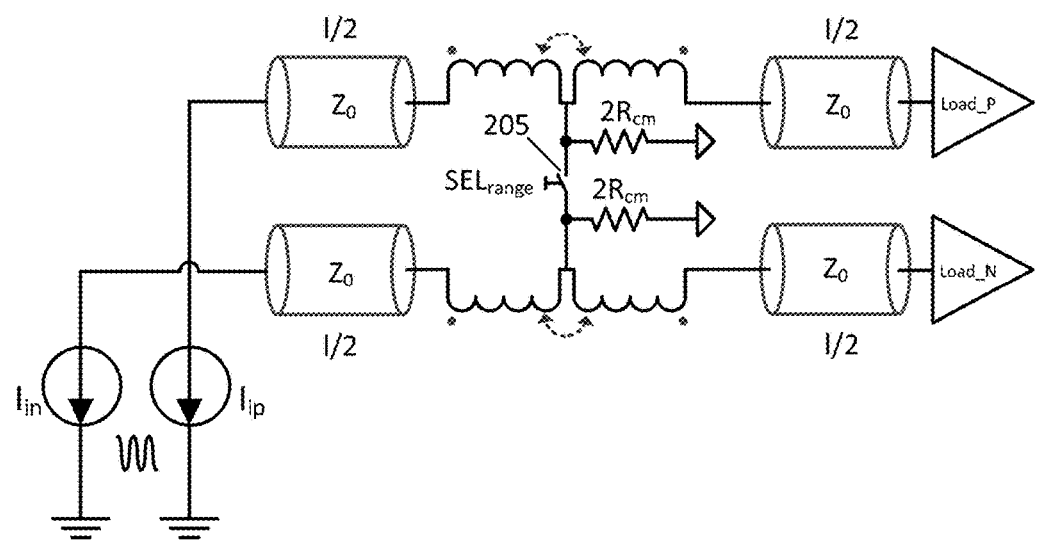
FIG. 18 is a circuit diagram of a transformer-based differential clock distribution network comprising a low-speed mode switch, according to an embodiment of the present disclosure.

FIG. 18 is a circuit diagram of a transformer-based differential clock distribution network comprising a low-speed mode switch 205, according to an embodiment of the present disclosure. To add further functionality to the fully differential structure, the switch 205 added in FIG. 18 is used to add low-speed functionality to this example embodiment. In example embodiments that omit the switch shown in FIG. 18, the resonant structure will only optimally work for a range of frequencies around the center of the passband ($f_0$). However, providing and opening the additional switch 205 in FIG. 18 changes the common-mode resistance into a differential mode resistance. Thus, this extends functionality to very low speed clocks. This can be important in practical systems where test-modes and built-in-system-tests (BIST) frequently make use of low-frequency clocks in addition to the full rate, high speed clock. Another advantage of this configuration is that the location of the switch resistance only reduces the Q of the shunt resonance, which helps to flatten the pass-band of the resonant structure.

Figure 19:
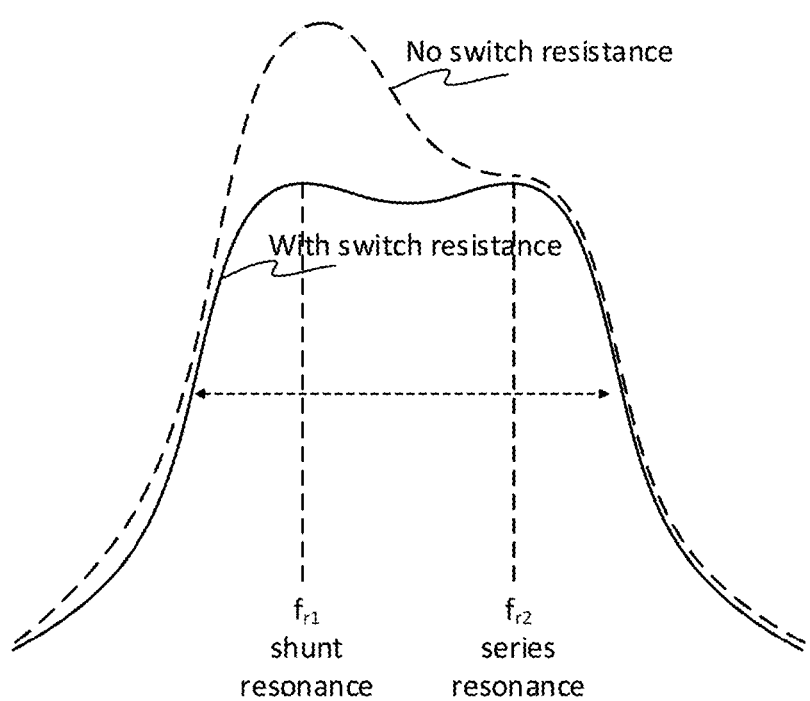
FIG. 19 is a graph of frequency response of the clock distribution network of FIG. 17.

In practical implementations which use transformer coupling, the shunt resonance (low-frequency) tends to have higher-Q than the series resonance (high-frequency) and thus, including some differential mode loss in the shunt path helps to flatten the pass-band as shown in FIG. 19, and leads to no degradation in performance. Note that this resistance has no effect on the series resonance since the entire shunt path is at AC-ground in this case as shown in FIG. 10. In the normal-mode (high-frequency) of operation the switch would remain closed putting the two resistances (2*$R_{cm}$) in parallel, which reduces this modified structure to the embodiment shown in FIG. 12, or generally in FIG. 11.

Figure 20:
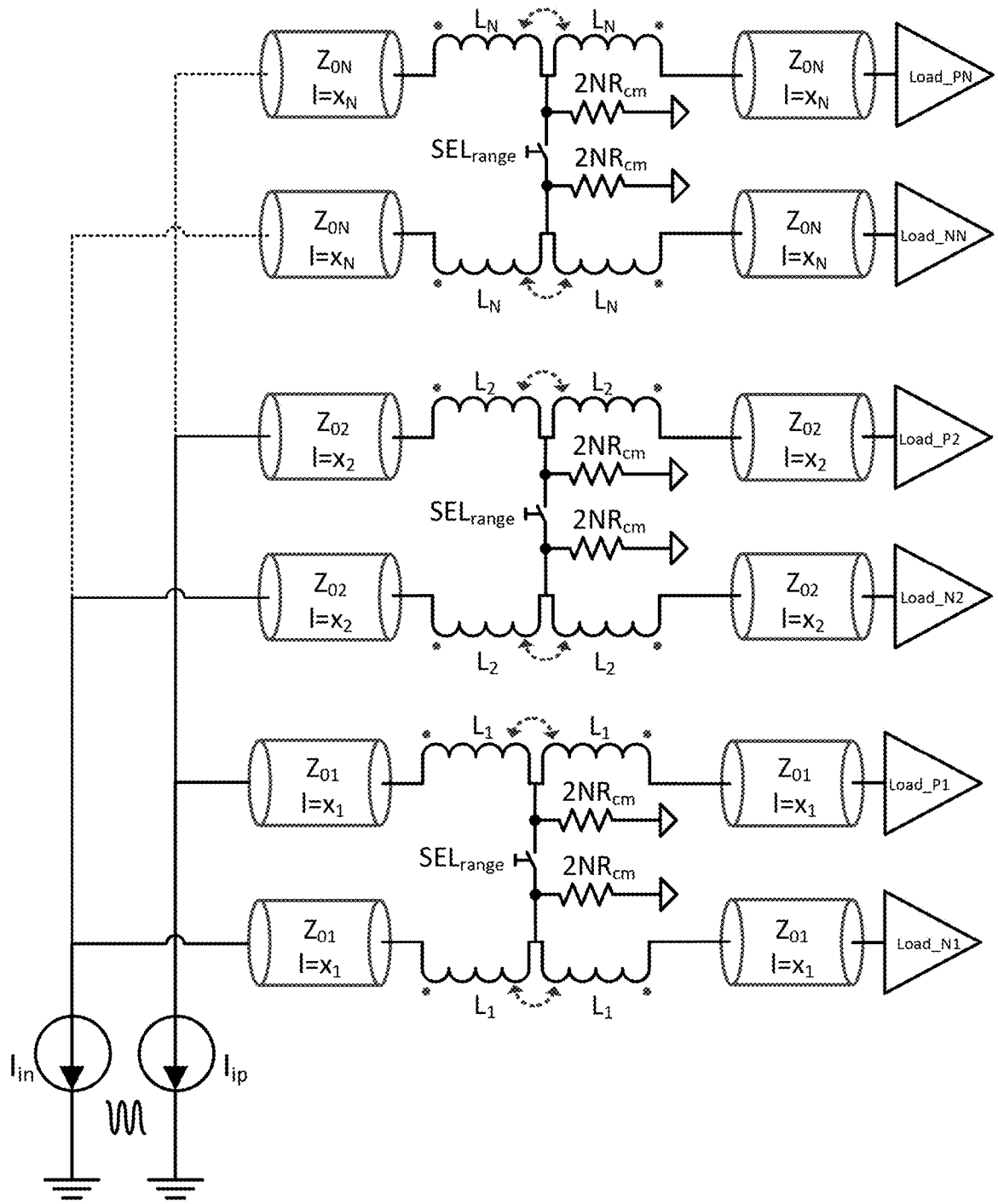
FIG. 20 is a circuit diagram of a point-to-multi-point clock distribution network according to an embodiment of the present disclosure.

Up until this point, only point-to-point implementations have been considered. In other embodiments of the present disclosure, the approach is extended to point-to-multi-point implementations. A more general case in a differential implementation is shown in the example embodiment of FIG. 20. In this example embodiment, multiple output branches are added in parallel to the resonant structure. Each of these branches acts as its own resonant structure with the transformer creating a "short" node in the center and high-impedance at either end. Note that each of these branches can have different lengths ($x_N$) with different transmission line impedances ($Z_{0N}$) and different corresponding transformer inductance ($L_N$). In all cases, however, each line is designed to have the same dual resonance frequencies described in FIG. 9 and FIG. 10. Note that in this example implementation the common-mode resistance is scaled up so that the total parallel equivalent resistance remains the same.

Figure 21:
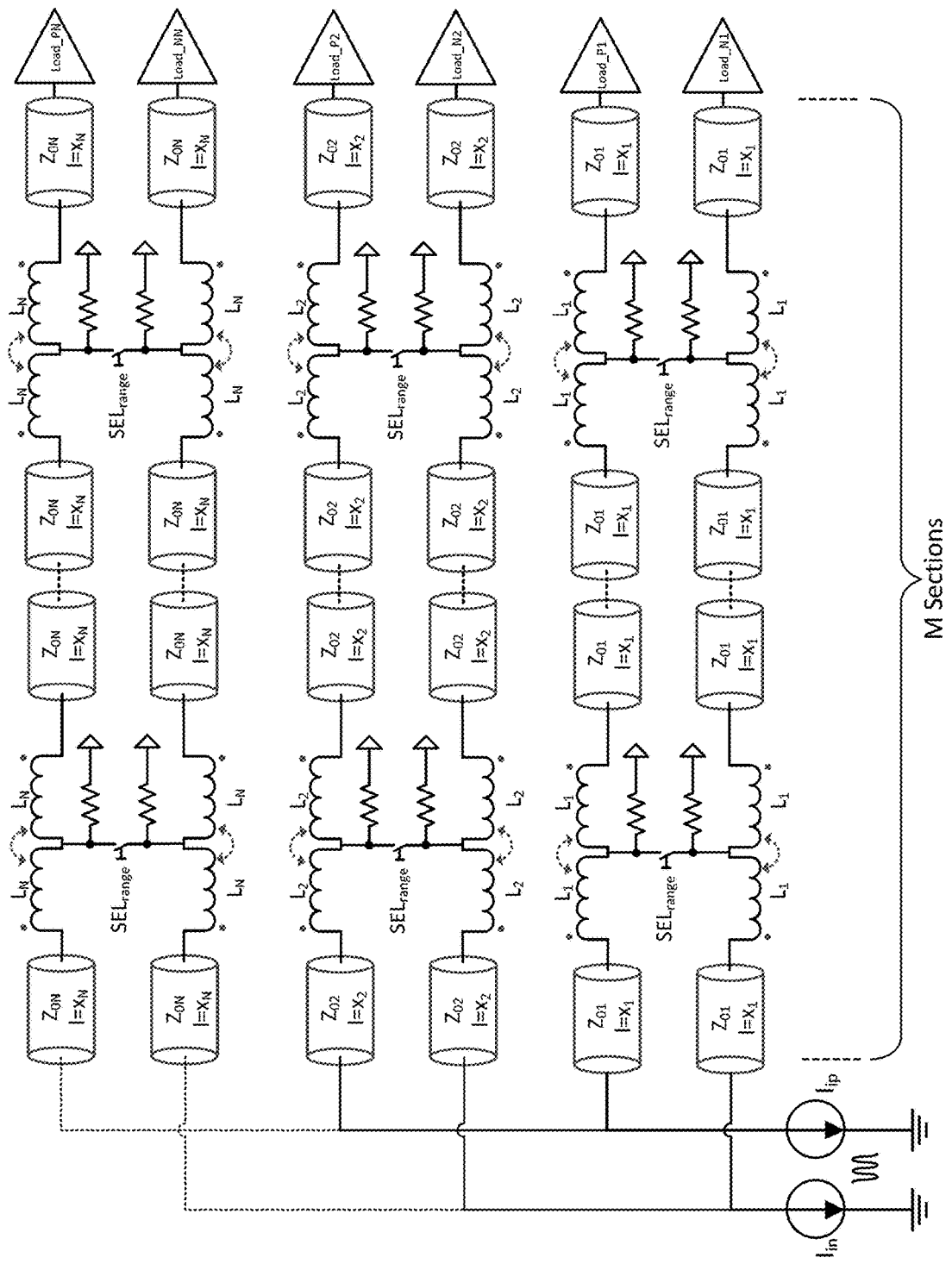
FIG. 21 is a circuit diagram of a multi-section, point-to-multi-point clock distribution network according to an embodiment of the present disclosure.

Depending on the length of the line, in an example embodiment it is advantageous to add in more fixed nodes along the length of the line. In cases where the total line length is greater than Mλ/2 (where M is an integer), it is advantageous to add at least M transformers down the length of the line as shown in the example embodiment of FIG. 21. Again, in this case, the common-mode resistances in each of the branches are scaled so that the total parallel equivalent resistance remains the same.

Figure 22:
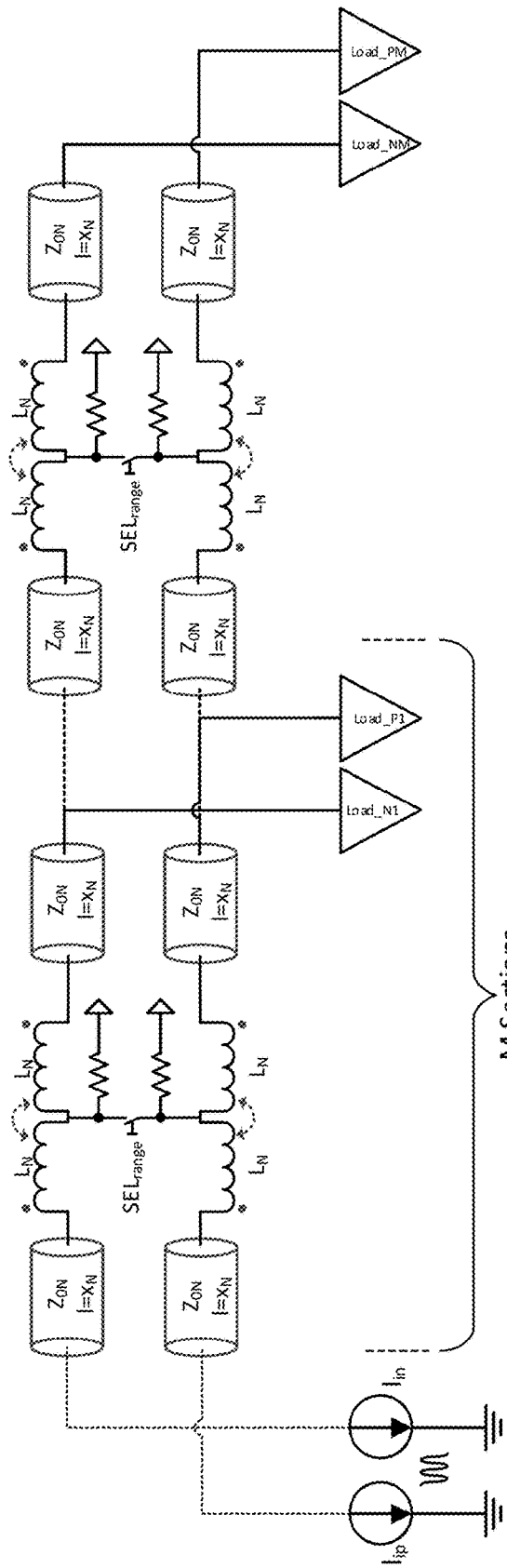
FIG. 22 is a circuit diagram of a multi-section, multi-output clock distribution network according to an embodiment of the present disclosure.

Another embodiment of the present disclosure also allows for outputs to be taken from multiple points along the length of each of the branches. A single branch with multiple outputs along the length of the branch is shown in the example embodiment of FIG. 22. Note that for optimal output swing, the output is taken at high-impedance nodes in the resonant structure. Following the same analysis as shown in FIG. 9 and FIG. 10, the periodic nature of the resonant structure will cause high-impedance nodes to occur at periodic intervals at equal separations (2*$x_N$) as shown.

According to another example embodiment, two or more previously described embodiments of the present disclosure are combined to extend the approach further such as multiple branches in parallel with multiple outputs along their length while maintaining all the benefits of the original structure. Furthermore, although the driving point circuitry in these examples were shown as current sources, in other embodiments CMOS voltage mode sources are used instead of the current sources. Embodiments of the present disclosure are agnostic to the type of circuitry used to inject power into the resonant structure.

For example, with respect to an embodiment with the resistor $R_{em}$, the clock distribution network in an embodiment is used with a current-mode driver and $R_{cm}$ is typically used to set the common-mode voltage along with $V_{cm}$. In another embodiment, the clock distribution network is used with a voltage-mode driver and typically very large $R_{em}$ to reduce DC current consumption.

According to further embodiments, the clock distribution network comprises two or more sections, each section being similar to one of the previously described single ended implementations.

Figure 23:
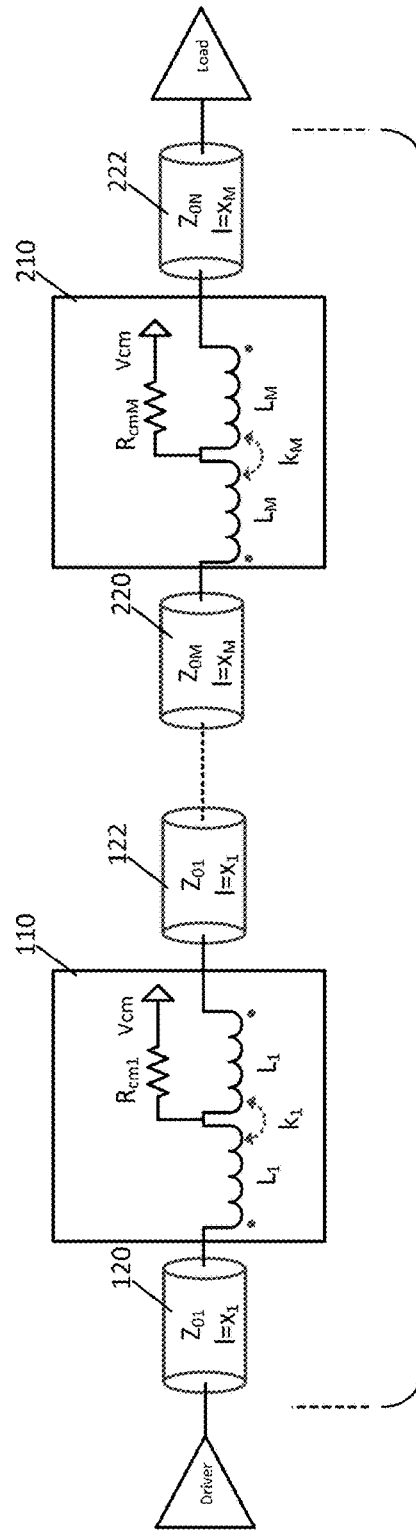
FIG. 23 is a circuit diagram of a single-ended multi-section clock distribution network according to an embodiment of the present disclosure.

FIG. 23 is a circuit diagram of a single-ended multi-section clock distribution network according to an embodiment of the present disclosure. In the clock distribution network of FIG. 23, the multi-port electrical network 110 as described in relation to FIG. 7, for example, is a first multi-port electrical network. The resonant structure created by the cooperation of the first multi-port electrical network and the first and second transmission line segments is called a first resonant structure with respect to FIG. 23.

In the embodiment of FIG. 23, the transmission line further comprises third and fourth transmission line segments 220 and 222 each having a source end and a load end. The clock distribution network of FIG. 23 further comprises a second multi-port electrical network 210 coupled between the load end of the third transmission line segment 220 and the source end of the fourth transmission line segment 222. The second multi-port electrical network 210 and the third and fourth transmission line segments 220 and 222 cooperate to create a second resonant structure.

The second multi-port electrical network 210 of FIG. 23 comprises a second series inductive reactance and a second shunt inductive susceptance (not shown) configured to influence the creation of the first low-frequency resonance and the second higher-frequency resonance, which were created by the series inductive reactance and the shunt inductive susceptance of the first multi-port electrical network 110. The first and second resonances cooperate to create the same bandpass response across the second resonant structure as the bandpass response across the first resonant structure. In another embodiment, the multi-port electrical network is repeated M-times and connected end to end; in other words, a clock distribution network comprises a plurality of multi-port electrical networks connected end to end.

Figure 24:
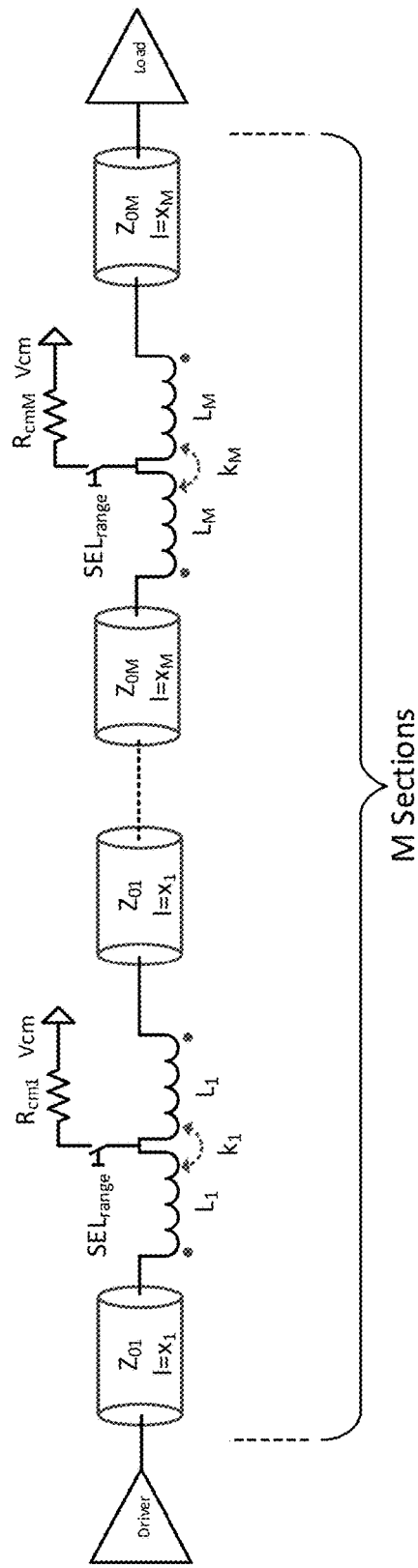
FIG. 24 is a circuit diagram of a single-ended multi-section clock distribution network comprising a low-speed mode switch, according to an embodiment of the present disclosure.

FIG. 24 is a circuit diagram of a single-ended multi-section clock distribution network comprising a low-speed mode switch, according to an embodiment of the present disclosure. The embodiment of FIG. 24 comprises with a "low-speed mode" switch on center tap of the transformer of the multi-port electrical networks.

Figure 25:
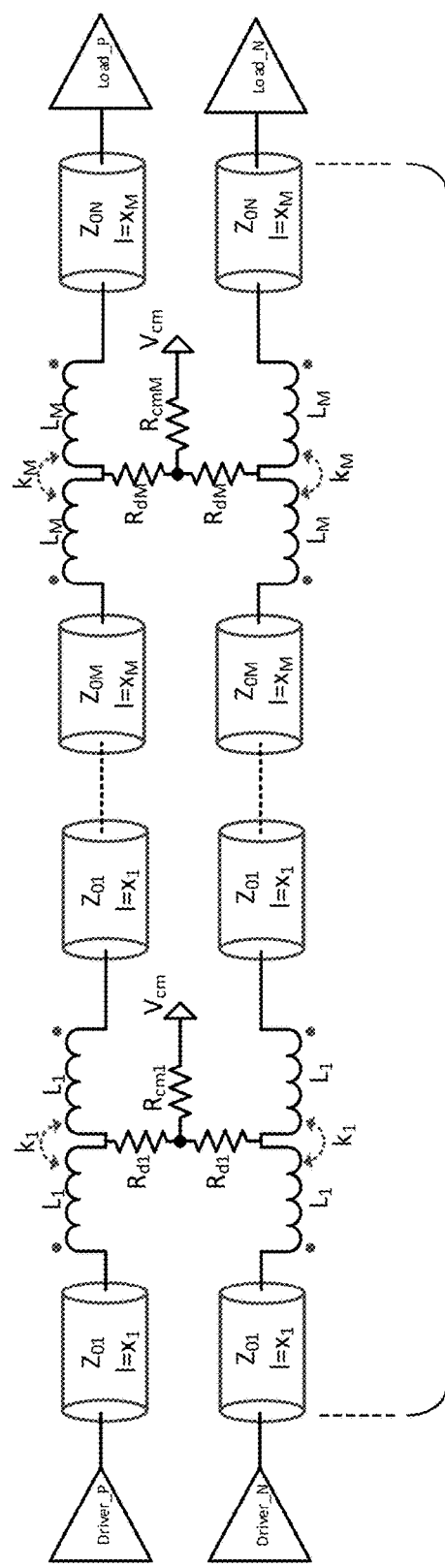
FIG. 25 is a circuit diagram of a differential multi-section clock distribution network according to an embodiment of the present disclosure.

FIG. 25 is a circuit diagram of a differential multi-section clock distribution network according to an embodiment of the present disclosure. FIG. 25 can be described as a differential clock distribution with a transmission line, one or more differential transformers (composed of four magnetically coupled inductors), a driver and a load. The example embodiment of FIG. 25 includes the following characteristics: driver on one end, load on the other end; transformer(s) (with inductance $L_M$ and coupling-coefficient $k_m$) placed along the length of the line separated by intervals of transmission line; the number of sections (M) and spacing between transformers ($x_M$) can be adjusted to optimize requirements of the system (M>=1); although one embodiment is with equal section lengths, and transformers, in other embodiments they are not identical; center-tap of the transformer connected to a low impedance voltage ($V_{cm}$); optional common-mode resistor ($R_{cmM}$) used to shift the common-mode voltage; optional $R_{dM}$ damping resistor connected to the common-tap terminal of the transformer to control the Q of the shunt resonance.

Figure 26:
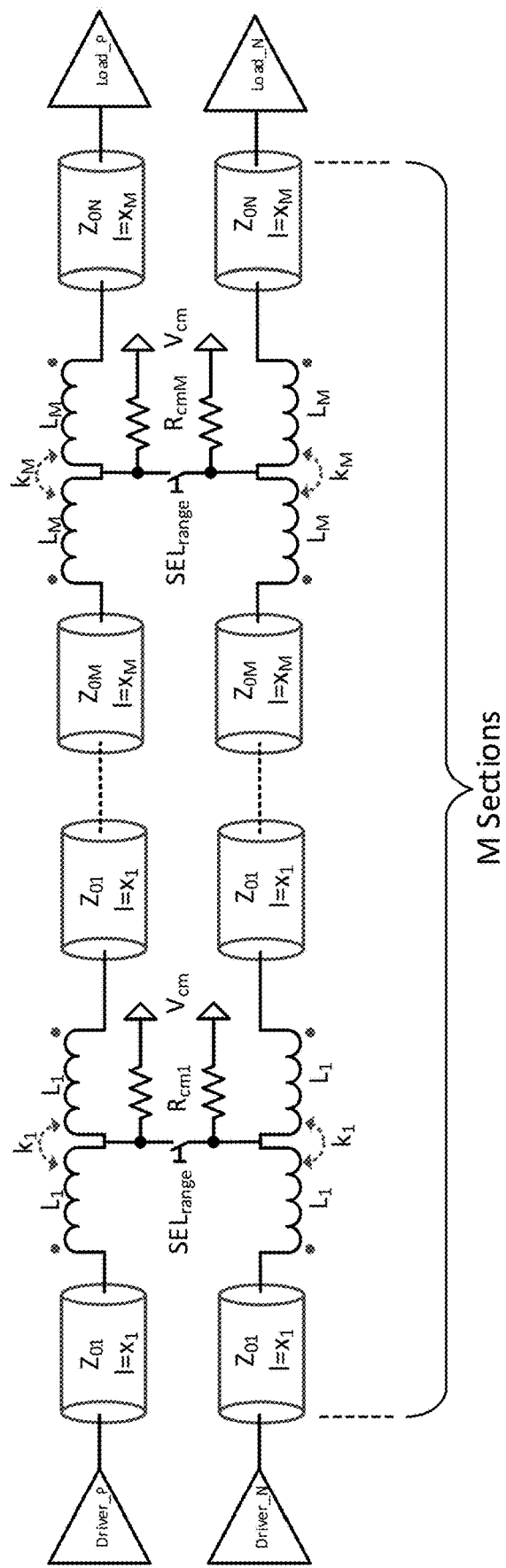
FIG. 26 is a circuit diagram of a differential multi-section clock distribution network comprising a low-speed mode switch, according to an embodiment of the present disclosure.

FIG. 26 is a circuit diagram of a differential multi-section clock distribution network comprising a low-speed mode switch, according to an embodiment of the present disclosure. The low-speed mode switch in FIG. 26 is similar in nature to the low-speed mode switch in FIGS. 18, 20-22 and 24, and a detailed discussion is omitted for the sake of brevity.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

What is claimed is:

1. A clock distribution network comprising:
    a transmission line having a first segment and a second segment;
    a multi-port electrical network coupled between the first segment and second segment of the transmission line, the multi-port electrical network comprising a passive electrical network configured to produce a first resonance and a second resonance that cooperate to create a bandpass response across a plurality of clock distribution frequencies associated with a bandwidth of a combination of the transmission line and the multi-port electrical network; and
    a single input and multiple outputs.

2. The clock distribution network of claim 1 wherein the multi-port electrical network comprises series and shunt reactive circuit.

3. The clock distribution network of claim 2 wherein the series and shunt reactive circuit elements comprise a plurality of series inductive reactances and an equal number of shunt inductive susceptances configured to create a plurality of resonances.

4. The clock distribution network of claim 1 wherein the passive electrical network comprises passive elements which only present a frequency-dependent, complex impedance to the transmission line segments connected to the multi-port electrical network.

5. The clock distribution network of claim 1 wherein the passive electrical network comprises passive elements, the passive elements having an equivalent impedance that varies with frequency and having a value that is unchanged with changes in frequency.

6. The clock distribution network of claim 1 wherein the passive electrical network comprises a two-port passive network.

7. The clock distribution network of claim 1 wherein the passive electrical network comprises a three-element inductive network.

8. The clock distribution network of claim 1 further comprising a multi-resonant structure comprising a combination of the multi-port electrical network and the transmission line.

9. A clock distribution network comprising:
    a transmission line having a first segment and a second segment;
    a multi-port electrical network coupled between the first segment and second segment of the transmission line, the multi-port electrical network comprising a passive electrical network configured to produce a first resonance and a second resonance that cooperate to create a bandpass response across a plurality of clock distribution frequencies associated with a bandwidth of a combination of the transmission line and the multi-port electrical network; and
    a point-to-multipoint implementation sending a clock from a single input point to multiple output points.

10. The clock distribution network of claim 9 further comprising a single input and multiple outputs.

11. The clock distribution network of claim 9 wherein the multi-port electrical network comprises series and shunt reactive circuit.

12. The clock distribution network of claim 11 wherein the series and shunt reactive circuit elements comprise a plurality of series inductive reactances and an equal number of shunt inductive susceptances configured to create a plurality of resonances.

13. The clock distribution network of claim 9 wherein the passive electrical network comprises passive elements which only present a frequency-dependent, complex impedance to the transmission line segments connected to the multi-port electrical network.

14. The clock distribution network of claim 9 wherein the passive electrical network comprises passive elements, the passive elements having an equivalent impedance that varies with frequency and having a value that is unchanged with changes in frequency.

15. The clock distribution network of claim 9 wherein the passive electrical network comprises a two-port passive network.

16. The clock distribution network of claim 9 wherein the passive electrical network comprises a three-element inductive network.

17. The clock distribution network of claim 9 further comprising a multi-resonant structure comprising a combination of the multi-port electrical network and the transmission line.

18. A clock distribution network comprising:
- a transmission line having a first segment and a second segment; and
- a multi-port electrical network coupled between the first segment and second segment of the transmission line, the multi-port electrical network comprising a passive electrical network configured to produce a first resonance and a second resonance that cooperate to create a bandpass response across a plurality of clock distribution frequencies associated with a bandwidth of a combination of the transmission line and the multi-port electrical network,
- wherein the multi-port electrical network comprises series and shunt reactive circuit, and
- wherein the series and shunt reactive circuit elements comprise a plurality of series inductive reactances and an equal number of shunt inductive susceptances configured to create a plurality of resonances.

19. The clock distribution network of claim 18 wherein the passive electrical network comprises passive elements which only present a frequency-dependent, complex impedance to the transmission line segments connected to the multi-port electrical network.

20. The clock distribution network of claim 18 wherein the passive electrical network comprises passive elements, the passive elements having an equivalent impedance that varies with frequency and having a value that is unchanged with changes in frequency.

\* \* \* \* \*